US012660591B2

(12) United States Patent
Koh et al.

(10) Patent No.: US 12,660,591 B2
(45) Date of Patent: Jun. 16, 2026

(54) INTEGRATED CIRCUIT (IC) DEVICE WITH METAL LAYER INCLUDING STAGGERED METAL LINES

(71) Applicant: Intel Corporation, Santa Clara, CA (US)

(72) Inventors: Shao Ming Koh, Tigard, OR (US); Patrick Morrow, Portland, OR (US); June Choi, Portland, OR (US); Sukru Yemenicioglu, Portland, OR (US); Nikhil Jasvant Mehta, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 4 days.

(21) Appl. No.: 17/936,014

(22) Filed: Sep. 28, 2022

(65) Prior Publication Data

US 2024/0105589 A1     Mar. 28, 2024

(51) Int. Cl.
*H10W 20/42* (2026.01)
*H10W 20/00* (2026.01)
*H10W 20/20* (2026.01)
*H10W 20/43* (2026.01)

(52) U.S. Cl.
CPC ......... *H10W 20/42* (2026.01); *H10W 20/033* (2026.01); *H10W 20/056* (2026.01); *H10W 20/20* (2026.01); *H10W 20/43* (2026.01)

(58) Field of Classification Search
CPC ......... H01L 21/76843; H01L 21/76877; H01L 23/481; H01L 23/528; H01L 21/76816; H01L 21/76831; H01L 21/76897; H01L 23/5283
See application file for complete search history.

(56) References Cited

U.S. PATENT DOCUMENTS

| | | | | |
|---|---|---|---|---|
| 2019/0326296 A1* | 10/2019 | Wang | ..................... | H10B 12/50 |
| 2019/0371891 A1* | 12/2019 | Goktepeli | ......... | H01L 21/30625 |
| 2021/0257295 A1* | 8/2021 | Chan | ................. | H01L 21/76877 |
| 2021/0407895 A1* | 12/2021 | Lin | ....................... | H05K 3/0094 |

* cited by examiner

*Primary Examiner* — Jeff W Natalini
*Assistant Examiner* — Rose Keagy
(74) *Attorney, Agent, or Firm* — Akona IP PC

(57) ABSTRACT

An IC device includes a metal layer that includes staggered metal lines. The metal lines are in two or more levels along a direction. There may be one or more metal lines in each level. At least some of the metal lines are aligned along the direction so that widths of the metal lines may be maximized for a given total width of the metal layer. The alignment of the metal lines may be achieved through DSA of a diblock copolymer. The metal layer may be connected to vias in two or more levels. The vias may be also connected to another metal layer or a semiconductor device in a FEOL section of the IC device. A via and the metal line connected to the via may be formed through a same recess and deposition process to eliminate interface between the via and metal line.

20 Claims, 28 Drawing Sheets

100

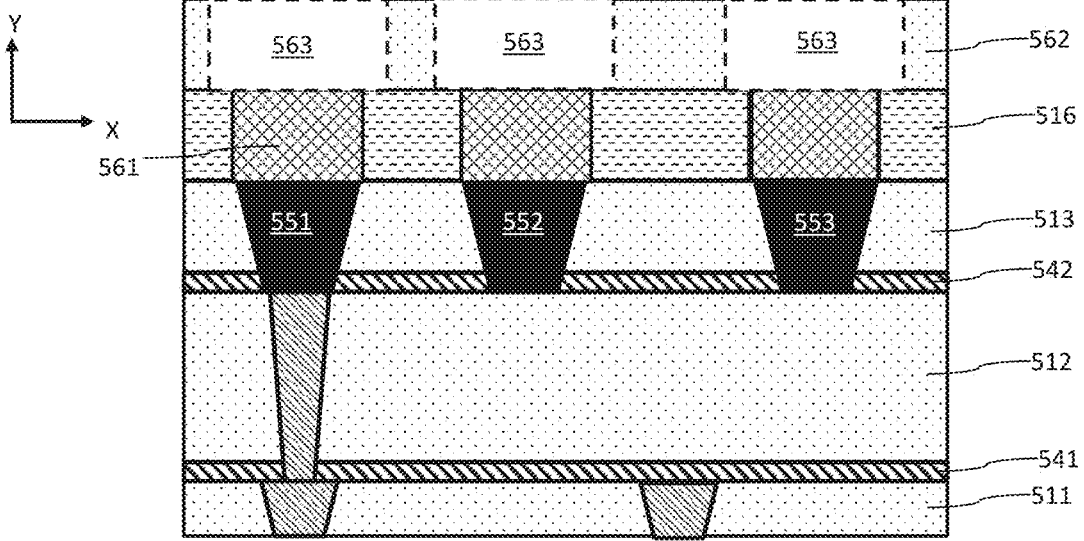
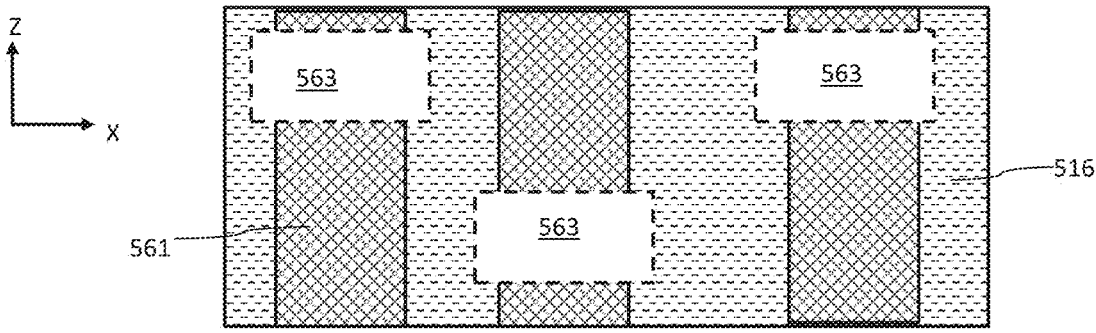
FIG. 5G

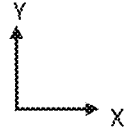
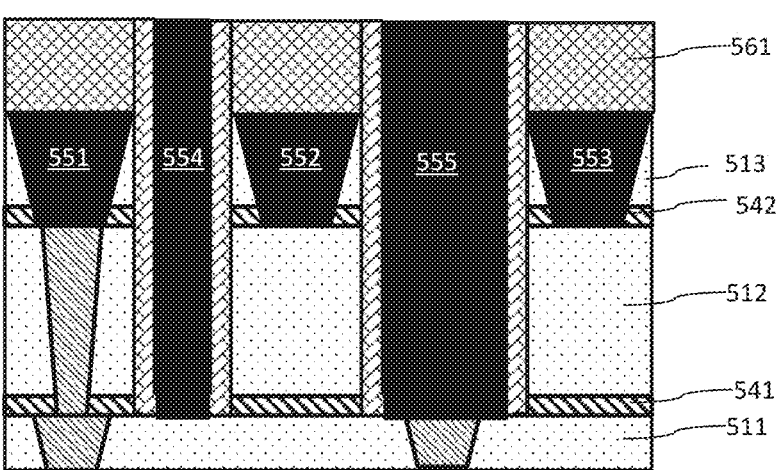
FIG. 5M
561
513
542
512
541
511
551   554   552   555   553
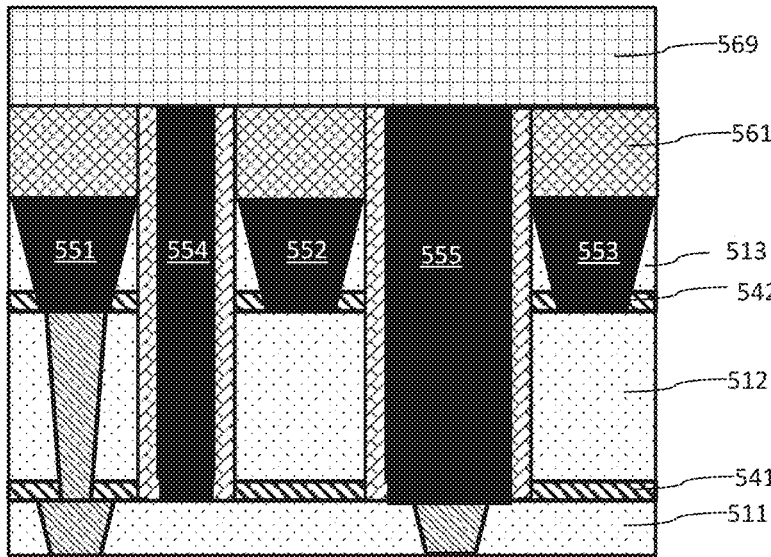
FIG. 5N
569
561
513
542
512
541
511
551   554   552   555   553

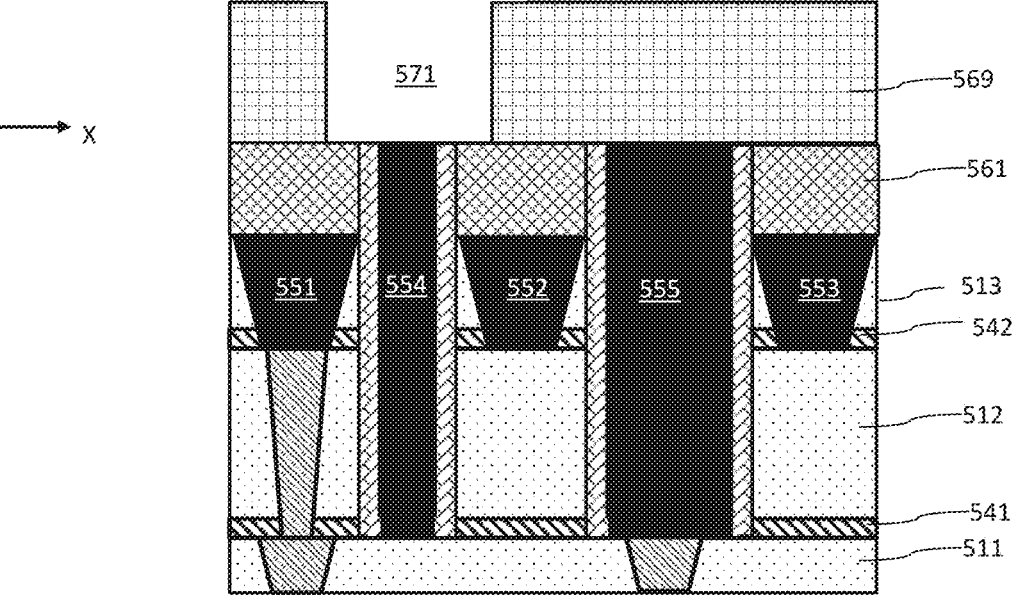
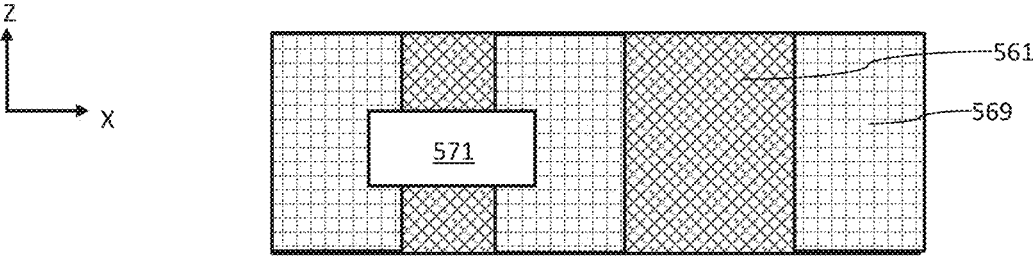
FIG. 50

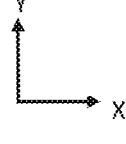
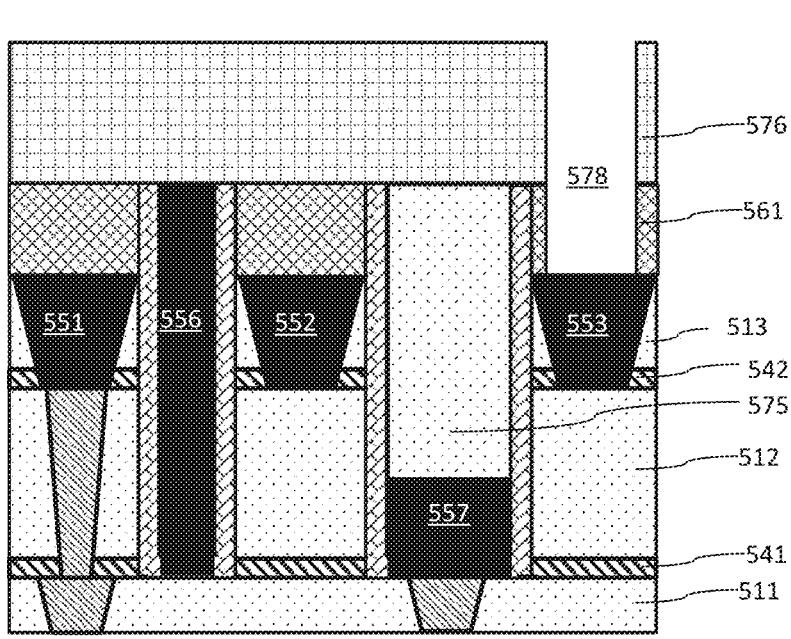
FIG. 5T

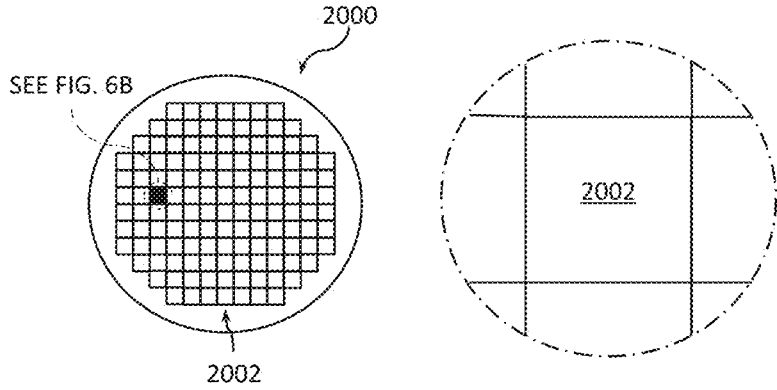
FIG. 6A                    FIG. 6B

INTEGRATED CIRCUIT (IC) DEVICE WITH METAL LAYER INCLUDING STAGGERED METAL LINES

BACKGROUND

IC fabrication usually includes two stages. The first stage is referred to as the front end of line (FEOL). The second stage is referred to as the back end of line (BEOL). In the FEOL, individual components (e.g., transistor, capacitors, resistors, etc.) can be patterned in a wafer. In the BEOL, metal layers, vias, and insulating layers can be formed to get the individual components interconnected. The BEOL usually starts with forming the first metal layer on the wafer. The first metal layer is often called M0. More metal layers can be formed on top of M0, and these metal layers are often called M1, M2, and so on.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example, and not by way of limitation, in the figures of the accompanying drawings.

FIGS. 6A-6B are top views of a wafer and dies that may include one or more varactor devices with backside electrical contact, according to some embodiments of the disclosure.

DETAILED DESCRIPTION

Figure 1:
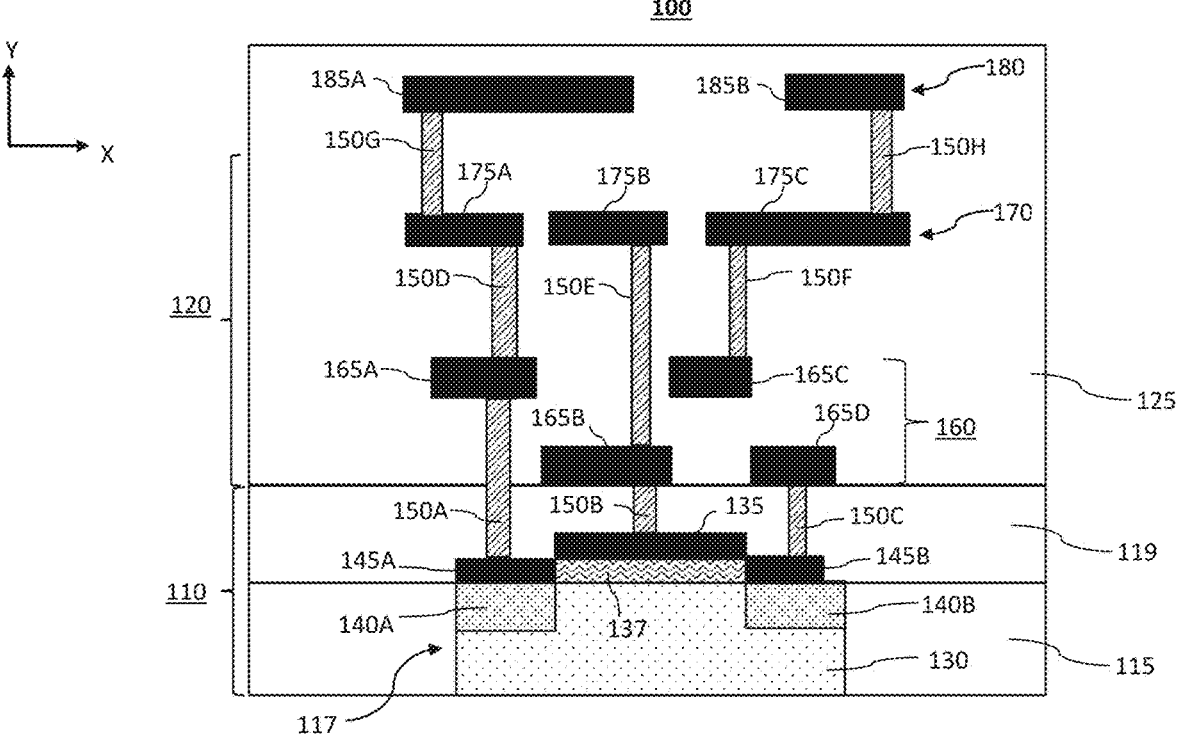
FIG. 1 illustrates an IC device comprising an FEOL section and a BEOL section, according to some embodiments of the disclosure.

The systems, methods, and devices of this disclosure each have several innovative aspects, no single one of which is solely responsible for all the desirable attributes disclosed herein. Details of one or more implementations of the subject matter described in this specification are set forth in the description below and the accompanying drawings.

Continued scaling of transistors and design cell height leads to narrow BEOL metal lines. This creates a challenge for metal patterning, via landing, or edge placement error control and the need to ensure low resistance of metal lines and vias. Taking via landing for example, a design with narrow metal lines reduces overlap margin and increases interface resistance due to small contact area. A solution to the challenge is to tighten edge placement error to ensure minimum overlap area between metal line and via. However, continual scaling of edge placement error is challenging. To ensure low metal resistance, using low resistance metals for metal lines is desired. For instance, many currently available technologies use Copper (Cu). However, resistance of Cu lines is expected to increase exponentially as the metal line scales. Therefore, improved technology for BEOL metal lines is needed.

Embodiments of the present disclosure may improve on at least some of the challenges and issues described above by providing metal layers with staggered metal lines, where widths of metal layers can be maximized for a given cell size. Wider metal lines can have lower resistance. Also, certain metal line-via interfaces can be minimized or even eliminated to further reduce resistance.

An example metal layer in the present disclosure includes metal lines arranged in different levels along a direction. A metal line may also be referred to as an interconnect. A metal layer may also be referred to as an interconnect set. The metal layer may be a low level BEOL metal layer, such as $M_X$, where X may be an integer between 0 and 7. In some embodiments, the metal layer includes a first metal line in a first layer, and a second metal line in a second layer. The first layer is over the second layer. The first layer may be farther from a semiconductor device (e.g., a transistor) than the second layer. The first layer may be closer to another metal layer than the second layer. The other metal layer may also be a low level BEOL metal layer or a mid-level BEOL metal layer (such as $M_Y$, where Y may be an integer between 8 and 10). As the first metal line and second metal line have different distances to the semiconductor device or the other metal layer, the first metal line and second metal line may be connected to vias of different lengths along the direction. Also, as the second metal line is in the lower level, the second metal line and a via connected to the second metal line may be formed in the same recessing and depositing process. The second metal line and the via may be a single metal structure, and interface resistance can be minimized or even eliminated.

The first metal line may be aligned with the second metal line in the same direction. For instance, an edge of the first metal line may be aligned (or substantially aligned) with an edge the second metal line. An edge of a metal line may be a side surface of the metal line. The alignment of the two metal lines may be facilitated by using self-assembled polymer materials. Given the alignment, the widths of the two metal lines in another direction (e.g., a direction orthogonal to the direction where the two metal lines are aligned) may be maximized. The metal line widths can be significantly greater than widths of conventionally available metal lines that are arranged in the same level where gaps between the conventionally available metal lines are required for insulating the metal lines from each other. In some embodiments, the width of the first or second metal line in the present disclosure may be two times or even more than widths of conventionally available metal lines. In an example, the width of a metal line in the present disclosure may be about 16 nm, versus the widths of many conventionally available metal lines are around 8 nm.

As the staggered metal lines in the present disclosure can have maximized widths and seamless contact with vias, the resistance of the metal layer can be minimized. As the widths of metal lines increase, the resistance of the metal lines decreases. With the seamless (or near seamless) metal line-via interface, the interface resistance is minimized. Also, the maximized widths can make it easier for arranging vias on the metal lines. Wider metal lines can provide better metal line-via overlap margin or process margin. Also, the separation of metal lines in multiple levels can reduce parasitic capacitance. In currently available designs where metal lines are lay adjacent to each other, scaling of the metal line spacings can increase capacitance and increase shorting risks. By staggering metal lines, the designs in the present disclosure can provide lower capacitance but more margin to avoid shorting risks. Therefore, the metal layers in the present disclosure can have better performance than conventionally available metal layers.

It should be noted that, in some settings, the term "nanoribbon" has been used to describe an elongated semiconductor structure that has a substantially rectangular transverse cross-section (e.g., a cross-section in a plane perpendicular to the longitudinal axis of the structure), while the term "nanowire" has been used to describe a similar structure but with a substantially circular or square transverse cross-sections. In the following, a single term "nanoribbon" is used to describe an elongated semiconductor structure independent of the shape of the transverse cross-section. Thus, as used herein, the term "nanoribbon" is used to cover elongated semiconductor structures that have substantially rectangular transverse cross-sections (possibly with rounded corners), elongated semiconductor structures that have substantially square transverse cross-sections (possibly with rounded corners), elongated semiconductor structures that have substantially circular or elliptical/oval transverse cross-sections, as well as elongated semiconductor structures that have any polygonal transverse cross-sections.

In the following, some descriptions may refer to a particular source or drain (S/D) region or contact being either a source region/contact or a drain region/contact. However, unless specified otherwise, which region/contact of a transistor or diode is considered to be a source region/contact and which region/contact is considered to be a drain region/contact is not important because, as is common in the field of FETs, designations of source and drain are often interchangeable. Therefore, descriptions of some illustrative embodiments of the source and drain regions/contacts provided herein are applicable to embodiments where the designation of source and drain regions/contacts may be reversed.

As used herein, the term "metal layer" may refer to a layer above a substrate that includes electrically conductive interconnect structures for providing electrical connectivity between different IC components. Metal layers described herein may also be referred to as "interconnect layers" to clearly indicate that these layers include electrically conductive interconnect structures which may, but do not have to be, metal.

The systems, methods and devices of this disclosure each have several innovative aspects, no single one of which is solely responsible for all of the desirable attributes disclosed herein. Details of one or more implementations of the subject matter described in this specification are set forth in the description below and the accompanying drawings.

In the following detailed description, various aspects of the illustrative implementations may be described using terms commonly employed by those skilled in the art to convey the substance of their work to others skilled in the art. For example, the term "connected" means a direct electrical or magnetic connection between the things that are connected, without any intermediary devices, while the term "coupled" means either a direct electrical or magnetic connection between the things that are connected, or an indirect connection through one or more passive or active intermediary devices. The term "circuit" means one or more passive and/or active components that are arranged to cooperate with one another to provide a desired function. If used, the terms "oxide," "carbide," "nitride," etc. refer to compounds containing, respectively, oxygen, carbon, nitrogen, etc., the term "high-k dielectric" refers to a material having a higher dielectric constant (k) than silicon oxide, while the term "low-k dielectric" refers to a material having a lower k than silicon oxide. The terms "substantially," "close," "approximately," "near," and "about," generally refer to being within +/-10%, e.g., within +/-5% or within +/-2%, of a target value based on the context of a particular value as described herein or as known in the art. Similarly, terms indicating orientation of various elements, e.g., "coplanar," "perpendicular," "orthogonal," "parallel," or any other angle between the elements, generally refer to being within +/-8% of a target value, e.g., within +/-5% of a target value or within +/-2% of a target value, based on the context of a particular value as described herein or as known in the art. Also, the term "or" refers to an inclusive "or" and not to an exclusive "or."

The terms "over," "under," "between," and "on" as used herein refer to a relative position of one material layer or component with respect to other layers or components. For example, one layer disposed over or under another layer may be directly in contact with the other layer or may have one or more intervening layers. Moreover, one layer disposed between two layers may be directly in contact with the two layers or may have one or more intervening layers. In contrast, a first layer "on" a second layer is in direct contact with that second layer. Similarly, unless explicitly stated otherwise, one feature disposed between two features may be in direct contact with the adjacent features or may have one or more intervening layers.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B, and C). The term "between," when used with reference to measurement ranges, is inclusive of the ends of the measurement ranges. As used herein, the notation "A/B/C" means (A), (B), and/or (C).

The description may use the phrases "in an embodiment" or "in embodiments," which may each refer to one or more of the same or different embodiments. Furthermore, the terms "comprising," "including," "having," and the like, as used with respect to embodiments of the present disclosure, are synonymous. The disclosure may use perspective-based descriptions such as "above," "below," "top," "bottom," and "side"; such descriptions are used to facilitate the discussion and are not intended to restrict the application of disclosed embodiments. The accompanying drawings are not necessarily drawn to scale. Unless otherwise specified, the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

In the following detailed description, reference is made to the accompanying drawings that form a part hereof, and in which is shown, by way of illustration, embodiments that may be practiced. It is to be understood that other embodiments may be utilized and structural or logical changes may be made without departing from the scope of the present disclosure. Therefore, the following detailed description is not to be taken in a limiting sense. For convenience, if a collection of drawings designated with different letters are present, e.g., FIGS. 7A-7B, such a collection may be referred to herein without the letters, e.g., as "FIG. 7."

In the drawings, some schematic illustrations of example structures of various devices and assemblies described herein may be shown with precise right angles and straight lines, but it is to be understood that such schematic illustrations may not reflect real-life process limitations which may cause the features to not look so "ideal" when any of the structures described herein are examined using e.g., scanning electron microscopy (SEM) images or transmission electron microscope (TEM) images. In such images of real structures, possible processing defects could also be visible, e.g., not-perfectly straight edges of materials, tapered vias or other openings, inadvertent rounding of corners or variations in thicknesses of different material layers, occasional screw, edge, or combination dislocations within the crystalline region, and/or occasional dislocation defects of single atoms or clusters of atoms. There may be other defects not listed here but that are common within the field of device fabrication. Inspection of layout and mask data and reverse engineering of parts of a device to reconstruct the circuit using e.g., optical microscopy, TEM, or SEM, and/or inspection of a cross-section of a device to detect the shape and the location of various device elements described herein using, e.g., Physical Failure Analysis (PFA) would allow determination of presence of varactor devices with backside electrical contacts as described herein.

Various operations may be described as multiple discrete actions or operations in turn in a manner that is most helpful in understanding the claimed subject matter. However, the order of description should not be construed as to imply that these operations are necessarily order dependent. In particular, these operations may not be performed in the order of presentation. Operations described may be performed in a different order from the described embodiment. Various additional operations may be performed, and/or described operations may be omitted in additional embodiments.

Various varactor devices with backside electrical contacts as described herein may be implemented in, or associated with, one or more components associated with an IC or/and may be implemented between various such components. In various embodiments, components associated with an IC include, for example, transistors, diodes, power sources, resistors, capacitors, inductors, sensors, transceivers, receivers, antennas, etc. Components associated with an IC may include those that are mounted on IC or those connected to an IC. The IC may be either analog or digital and may be used in a number of applications, such as microprocessors, optoelectronics, logic blocks, audio amplifiers, etc., depending on the components associated with the IC. The IC may be employed as part of a chipset for executing one or more related functions in a computer.

FIG. 1 illustrates an IC device 100 comprising an FEOL section 110 and a BEOL section 120, according to some embodiments of the disclosure. The FEOL section 110 includes a support structure 115, a transistor 117, and an insulative structure 119. The BEOL section 120 includes metal layers 160, 170, and 180 and an insulative structure 125. In other embodiments, the IC device 100 may include fewer, more, or different components. For instance, the FEOL section 110 may include more transistors, or other semiconductor devices not shown in FIG. 1. Also, the BEOL section 120 may include fewer or more metal layers.

The support structure 115 may be any suitable structure, such as a substrate, a die, a wafer, or a chip, based on which the transistor 117 can be built. The support structure 115 may, e.g., be the wafer 2000 of FIG. 6A, discussed below, and may be, or be included in, a die, e.g., the singulated die 2002 of FIG. 6B, discussed below. In some embodiments, the support structure 115 may be a semiconductor substrate composed of semiconductor material systems including, for example, N-type or P-type materials systems, and, in some embodiments, the channel region 130, described herein, may be a part of the support 115. In some embodiments, the semiconductor substrate may be a crystalline substrate formed using a bulk silicon or a silicon-on-insulator substructure. In other embodiments, the semiconductor substrate may be formed using alternate materials, which may or may not be combined with silicon, that include but are not limited to germanium, indium antimonide, lead telluride, indium arsenide, indium phosphide, gallium arsenide, indium gallium arsenide, gallium antimonide, or other combinations of group III-V, group II-VI, or group IV materials. In some embodiments, the substrate may be non-crystalline. In some embodiments, the support structure may be a printed circuit board (PCB) substrate. One or more transistors, such as the transistor 117 may be built on the support 115.

Although a few examples of materials from which the support structure 115 may be formed are described here, any material that may serve as a foundation upon which an IC may be built falls within the spirit and scope of the present disclosure. In various embodiments, the support structure 115 may include any such substrate, possibly with some layers and/or devices already formed thereon, not specifically shown in the present figures. As used herein, the term "support" does not necessarily mean that it provides mechanical support for the IC devices/structures (e.g., transistors, capacitors, interconnects, and so on) built thereon. For example, some other structure (e.g., a carrier substrate or a package substrate) may provide such mechanical support and the support structure 115 may provide material "support" in that, e.g., the IC devices/structures described herein are build based on the semiconductor materials of the support 115. However, in some embodiments, the support structure 115 may provide mechanical support.

The transistor 117 may be a field-effect transistor (FET), such as metal-oxide-semiconductor FET (MOSFET), tunnel FET (TFET), fin-based transistor (e.g., FinFET), nanoribbon-based transistor, nanowire-based transistor, gate-all-around (GAA) transistor, other types of FET, or a combination of both. A transistor 117 includes a semiconductor structure that includes a channel region 130, a source region 140A, and a drain region 140B. The semiconductor structure of the transistor 117 may be at least partially in the support 115. The support structure 115 may include a semiconductor material, from which at least a portion of the semiconductor structure is formed. The semiconductor structure of the transistor 117 (or a portion of the semiconductor structure, e.g., the channel region 130) may be a planar structure or a non-planar structure. A non-planar structure is a three-dimensional structure, such as fin, nanowire, or nanoribbon. A non-planar structure may have a longitudinal axis and a transvers cross-section perpendicular to the longitudinal axis. In some embodiments, a dimension of the non-planar structure along the longitudinal axis may be greater than dimensions along other directions, e.g., directions along axes perpendicular to the longitudinal axis.

The channel region 130 includes a channel material. The channel material may be composed of semiconductor material systems including, for example, n-type or p-type materials systems. In some embodiments, the channel material may include a high mobility oxide semiconductor material, such as tin oxide, antimony oxide, indium oxide, indium tin oxide, titanium oxide, zinc oxide, indium zinc oxide, gallium oxide, titanium oxynitride, ruthenium oxide, or tungsten oxide. In some embodiments, the channel material may include a compound semiconductor with a first sub-lattice of at least one element from Group III of the periodic table (e.g., Al, Ga, In), and a second sub-lattice of at least one element of group V of the periodic table (e.g., P, As, Sb). In some embodiments, the channel material may include a compound semiconductor with a first sub-lattice of at least one element from Group II of the periodic table (e.g., Zn, Cd, Hg), and a second sub-lattice of at least one element of Group IV of the periodic table (e.g., C, Si, Ge, Sn, Pb). In some embodiments, the channel material is an epitaxial semiconductor material deposited using an epitaxial deposition process. The epitaxial semiconductor material may have a polycrystalline structure with a grain size between about 2 nm and 100 nm, including all values and ranges therein.

For some example n-type transistor embodiments (i.e., for the embodiments where the transistor 117 is an NMOS (N-type metal-oxide-semiconductor) transistor or an n-type TFET), the channel material may advantageously include a III-V material having a high electron mobility, such as, but not limited to InGaAs, InP, InSb, and InAs. For some such embodiments, the channel material may be a ternary III-V alloy, such as InGaAs, GaAsSb, InAsP, or InPSb. For some InxGa1-xAs fin embodiments, In content (x) may be between 0.6 and 0.9, and may advantageously be at least 0.7 (e.g., In0.7Ga0.3As). In some embodiments with highest mobility, the channel material may be an intrinsic III-V material, i.e., a III-V semiconductor material not intentionally doped with any electrically active impurity. In alternate embodiments, a nominal impurity dopant level may be present within the channel material, for example to further fine-tune a threshold voltage Vt, or to provide HALO pocket implants, etc. Even for impurity-doped embodiments however, impurity dopant level within the channel material 304 may be relatively low, for example below 1015 dopant atoms per cubic centimeter (cm−3), and advantageously below $10^{13}$ cm$^{-3}$. These materials may be amorphous or polycrystalline, e.g., having a crystal grain size between 0.5 nanometers and 100 nanometers.

For some example p-type transistor embodiments (i.e., for the embodiments where the transistor 117 is a PMOS (P-type metal-oxide-semiconductor) transistor or a p-type TFET), the channel material may advantageously be a Group IV material having a high hole mobility, such as, but not limited to Ge or a Ge-rich SiGe alloy. For some example embodiments, the channel material may have a Ge content between 0.6 and 0.9, and advantageously may be at least 0.7. In some embodiments with highest mobility, the channel material may be intrinsic III-V (or IV for P-type devices) material and not intentionally doped with any electrically active impurity. In alternate embodiments, one or more a nominal impurity dopant level may be present within the channel material, for example to further set a threshold voltage (Vt), or to provide HALO pocket implants, etc. Even for impurity-doped embodiments however, impurity dopant level within the channel portion is relatively low, for example below $10^{15}$ cm$^{-3}$, and advantageously below $10^{13}$ cm$^{-3}$. These materials may be amorphous or polycrystalline, e.g., having a crystal grain size between 0.5 nanometers and 100 nanometers.

In some embodiments, the channel material may include a high mobility oxide semiconductor material, such as tin oxide, antimony oxide, indium oxide, indium tin oxide, titanium oxide, zinc oxide, indium zinc oxide, indium gallium zinc oxide (IGZO), gallium oxide, titanium oxynitride, ruthenium oxide, aluminum zinc oxide, or tungsten oxide. In general, for a thin-film transistor (TFT), the channel material may include one or more of tin oxide, cobalt oxide, copper oxide, antimony oxide, ruthenium oxide, tungsten oxide, zinc oxide, gallium oxide, titanium oxide, indium oxide, titanium oxynitride, indium tin oxide, indium zinc oxide, nickel oxide, niobium oxide, copper peroxide, IGZO, indium telluride, molybdenite, molybdenum diselenide, tungsten diselenide, tungsten disulfide, molybdenum disulfide, N- or P-type amorphous or polycrystalline silicon, monocrystalline silicon, germanium, indium arsenide, indium gallium arsenide, indium selenide, indium antimonide, zinc antimonide, antimony selenide, silicon germanium, gallium nitride, aluminum gallium nitride, indium phosphite, black phosphorus, zinc sulfide, indium sulfide, gallium sulfide, each of which may possibly be doped with one or more of gallium, indium, aluminum, fluorine, boron, phosphorus, arsenic, nitrogen, tantalum, tungsten, and magnesium, etc. In some embodiments, a thin-film channel material may be deposited at relatively low temperatures, which allows depositing the channel material within the thermal budgets imposed on back-end fabrication to avoid damaging other components, e.g., front end components such as logic devices.

As noted above, the channel material may include IGZO. IGZO-based devices have several desirable electrical and manufacturing properties. IGZO has high electron mobility compared to other semiconductors, e.g., in the range of 20-50 times than amorphous silicon. Furthermore, amorphous IGZO (a-IGZO) transistors are typically characterized by high band gaps, low-temperature process compatibility, and low fabrication cost relative to other semiconductors.

IGZO can be deposited as a uniform amorphous phase while retaining higher carrier mobility than oxide semiconductors such as zinc oxide. Different formulations of IGZO include different ratios of indium oxide, gallium oxide, and zinc oxide. One particular form of IGZO has the chemical formula $InGaO_3(ZnO)_5$. Another example form of IGZO has an indium:gallium:zinc ratio of 1:2:1. In various other examples, IGZO may have a gallium to indium ratio of 1:1, a gallium to indium ratio greater than 1 (e.g., 2:1, 3:1, 4:1, 5:1, 6:1, 7:1, 8:1, 9:1, or 10:1), and/or a gallium to indium ratio less than 1 (e.g., 1:2, 1:3, 1:4, 1:5, 1:6, 1:7, 1:8, 1:9, or 1:10). IGZO can also contain tertiary dopants such as aluminum or nitrogen.

The source region 140A and the drain region 140B are connected to the channel region 130. The source region 140A and the drain region 140B each includes a semiconductor material with dopants. In some embodiments, the source region 140A and the drain region 140B have the same semiconductor material, which may be the same as the channel material of the channel region 130. A semiconductor material of the source region 140A or the drain region 140B may be a Group IV material, a compound of Group IV materials, a Group III/V material, a compound of Group III/V materials, a Group II/VI material, a compound of Group II/VI materials, or other semiconductor materials.

Example Group II materials include zinc (Zn), cadmium (Cd), and so on. Example Group III materials include aluminum (Al), boron (B), indium (In), gallium (Ga), and so on. Example Group IV materials include silicon (Si), germanium (Ge), carbon (C), etc. Example Group V materials include nitrogen (N), phosphorus (P), arsenic (As), antimony (Sb), and so on. Example Group VI materials include sulfur (S), selenium (Se), tellurium (Te), oxygen (O), and so on. A compound of Group IV materials can be a binary compound, such as SiC, SiGe, and so on. A compound of Group III/V materials can be a binary, tertiary, or quaternary compound, such as GaN, InN, and so on. A compound of Group II/VI materials can be a binary, tertiary, or quaternary compounds, such as CdSe, CdS, CdTe, ZnO, ZnSe, ZnS, ZnTe, CdZnTe, CZT, HgCdTe, HgZnTe, and so on.

In some embodiments, the dopants in the source region 140A and the drain region 140B are the same type. In other embodiments, the dopants of the source region 140A and the drain region 140B may be different (e.g., opposite) types. In an example, the source region 140A has n-type dopants and the drain region 140B has p-type dopants. In another example, the source region 140A has p-type dopants and the drain region 140B has n-type dopants. Example n-type dopants include Te, S, As, tin (Sn), Si, Ga, Se, S, In, Al, Cd, chlorine (Cl), iodine (I), fluorine (F), and so on. Example p-type dopants include beryllium (Be), Zn, magnesium (Mg), Sn, P, Te, lithium (Li), sodium (Na), Ga, Cd, and so on.

In some embodiments, the source region 140A and the drain region 140B may be highly doped, e.g., with dopant concentrations of about $1 \cdot 10^{21}$ cm$^{-3}$, in order to advantageously form Ohmic contacts with the respective S/D contacts (also sometimes interchangeably referred to as "S/D electrodes"), although these regions may also have lower dopant concentrations and may form Schottky contacts in some implementations. Irrespective of the exact doping levels, the source region 140A and the drain region 140B may be the regions having dopant concentration higher than in other regions, e.g., higher than a dopant concentration in the channel region 130, and, therefore, may be referred to as "highly doped" (HD) regions.

The channel region 130 may include one or more semiconductor materials with doping concentrations significantly smaller than those of the source region 140A and the drain region 140B. For example, in some embodiments, the channel material of the channel region 130 may be an intrinsic (e.g., undoped) semiconductor material or alloy, not intentionally doped with any electrically active impurity. In alternate embodiments, nominal impurity dopant levels may be present within the channel material, for example to set a threshold voltage Vt, or to provide HALO pocket implants, etc. In such impurity-doped embodiments however, impurity dopant level within the channel material is still significantly lower than the dopant level in the source region 140A and the drain region 140B, for example below $10^{15}$ cm$^{-3}$ or below $10^{13}$ cm$^{-3}$. Depending on the context, the term "S/D terminal" may refer to a S/D region or a S/D contact or electrode of a transistor.

The transistor 117 also includes a source contact 145A over the source region 140A and a drain contact 145B over the drain region 140B. The source contact 145A and the drain contact 145B are electrically conductive and may be coupled to source and drain terminals for receiving electrical signals. The source contact 145A or the drain contact 145B includes one or more electrically conductive materials, such as metals. Examples of metals in the source contact 145A and the drain contact 145B may include, but are not limited to, Ru, Cu, Co, palladium (Pd), platinum (Pt), nickel (Ni), and so on.

The transistor 117 also includes a gate that is over or wraps around at least a portion of the channel region 130. The gate includes a gate electrode 135 and a gate insulator 137. The gate electrode 135 can be coupled to a gate terminal that controls gate voltages applied on the transistor 117. The gate electrode 135 may include one or more gate electrode materials, where the choice of the gate electrode materials may depend on whether the transistor 117 is a p-type transistor or an n-type transistor. For a p-type transistor, gate electrode materials that may be used in different portions of the gate electrode may include, but are not limited to, Ru, Pd, Pt, Co, Ni, and conductive metal oxides (e.g., ruthenium oxide). For an n-type transistor, gate electrode materials that may be used in different portions of the gate electrode, but are not limited to, hafnium, zirconium, titanium, tantalum, aluminum, alloys of these metals, and carbides of these metals (e.g., hafnium carbide, zirconium carbide, titanium carbide, tantalum carbide, and aluminum carbide). In some embodiments, the gate electrode 135 may include a stack of a plurality of gate electrode materials, where zero or more materials of the stack are workfunction (WF) materials and at least one material of the stack is a fill metal layer. Further materials/layers may be included next to the gate electrode for other purposes, such as to act as a diffusion barrier layer or/and an adhesion layer.

The gate insulator 137 separates at least a portion of the channel region 130 from the gate electrode 135 so that the channel region 130 is insulated from the gate electrode 135. In some embodiments, the gate insulator 137 may wrap around at least a portion of the channel region 130. The gate insulator 137 may also wrap around at least a portion of the source region 140A or the drain region 140B. At least a portion of the gate insulator 137 may be wrapped around by the gate electrode. The gate insulator 137 includes an electrical insulator, such as a dielectric material, hysteretic material, and so on. Example dielectric material includes oxide (e.g., Si based oxides, metal oxides, etc), high-k dielectric, and so on. Example hysteretic material include ferroelectric materials, antiferroelectric materials, etc.

In the embodiments of FIG. 1, the transistor 117 is coupled to the metal layer 160. The metal layer 160 is further couples to the metal layers 170 and 180. The metal layer 160, 170, or 180 may facilitate supply of electrical signals to the transistor 117. Even though not shown in FIG. 1, the metal layer 160, 170, or 180 may be coupled with other devices than the transistor 117, such as diodes, power sources, resistors, capacitors, inductors, sensors, transceivers, receivers, antennas. The transistor 117 and the metal layers 160, 170, and 180 are coupled through vias 150A-150H (collectively referred to as "vias 150" or "via 150"). A via 150 may be electrically conductive. A via 150 may include a metal, such as tungsten (W), molybdenum (Mo), ruthenium (Ru), or other metals. Different vias 150 may include different materials. The vias 150 can provide a conductive channel between the transistor 117 and the metal layer 160 or between two of the metal layers 160, 170, and 180.

The metal layers 160, 170, and 180 are stacked over the transistor 117 along the Y axis. A metal layer 160, 170, or 180 may also be referred to as an interconnect set. A metal layer 160, 170, or 180 may include one or more metal lines. A metal line may also be referred to as an interconnect. The metal layer 160 may be the metal layer that is arranged closest to the FEOL section 110. In some embodiments, the metal layer 160 may be referred to as M0. The metal layer 170 may be referred to as M1. The metal layer 180 may be referred to as M2. There may be one or more metal layers that are arranged on top of the metal layer 180, which may be referred to as M3, M4, and so on. Certain portions of the metal layers 160, 170, and 180 may be insulated from each other by an insulative structure 125. The insulative structure 125 may include one or more electrical insulators. An electrical insulator may be a dielectric material, hysteretic material, and so on. Example dielectric material includes oxide (e.g., Si based oxides, metal oxides, etc), low-k dielectric, high-k dielectric, and so on. Example hysteretic material include ferroelectric materials, antiferroelectric materials, etc.

The metal layer 160 includes metal lines 165A-165D. For purpose of illustration, FIG. 1 shows three metal lines in the metal layer 160. In other embodiments, the metal layer 160 may include fewer or more metal lines. Each of the metal lines 165A-165D is an electrically conductive structure. In some embodiments, an individual one of the metal lines 165A-165D includes a metal, such as W, Ru, Mo, or other metals. The metal lines 165A-165D are shown as rectangles in FIG. 1. The metal lines 165A-165C may have different shapes. The metal layer 160 is connected to the transistor 117 through the vias 150A-150C. The vias 150A-150C are separated from each other by one or more electrical insulators in the insulative structure 119. For purpose of illustration, the metal line 165A is connected to the source contact 145A through the via 150A, the metal line 1653 is connected to the gate electrode 135 through the via 150B, and the metal line 165D is connected to the drain contact 145B through the via 150C. In other embodiments, the electrical connection between the metal layer 160 and the transistor 117 may be different. The metal layer 160 may facilitate controlling operation of the transistor 117 by providing electrical signals to the source contact 145A, the drain contact 145B, and the gate electrode 135. The metal lines 165A-165D are insulated from each other by one or more electrical insulators in the insulative structure 125. The metal lines 165A-165D may be at different electrical potentials during operation of the IC device 100.

In the embodiment of FIG. 1, the metal lines 165A-165D are not aligned along the X axis. Rather, the metal lines 165A-165D are distributed in two different levels may be at a level in a direction along the Y axis and constitute a staggered structure. The metal lines 165A and 165C is at the first level, and the metal lines 1658 and 165D is at the second level below the first level along the Y axis. As shown in FIG. 1, the metal line 165A is aligned with the metal line 165C along the X axis but is not aligned with the metal lines 1658 and 165D. The metal line 1658 is aligned with the metal line 165D along the X axis. Compared with a metal layer (e.g., the metal layer 170 or 180) that includes metal lines arranged in the same level, the separation of the metal lines 165A-165D of the metal layer 160 into the two levels can lead to lower parasitic capacitance.

Given the distribution of the metal lines 165A-165D in the two different levels, the vias 150A-150C may also have two levels. For instance, the via 150A is longer than the via 150B or 150C along the Y axis. In some embodiments, the via 150A may include two sections that are formed in two separate via formation processes. In other embodiments, the via 150 may be formed in a single via formation process.

In some embodiments, the metal lines 165A and 165C in the first level and the metal lines 1658 and 165D in the second level may be aligned along the Y axis. For instance, an edge (e.g., the right edge in FIG. 1) of the metal line 165A may be aligned (or substantively aligned) with an edge (e.g., the left edge in FIG. 1) of the metal line 1658 along the Y axis. Similarly, an edge (e.g., the right edge in FIG. 1) of the metal line 1658 may be aligned (or substantively aligned) with an edge (e.g., the left edge in FIG. 1) of the metal line 165C along the Y axis, and an edge (e.g., the right edge in FIG. 1) of the metal line 165C may be aligned (or substantively aligned) with an edge (e.g., the left edge in FIG. 1) of the metal line 165D along the Y axis. The alignments (or substantial alignments) of the edges of the metal lines 165A-165D may allow maximization of widths of the metal lines 165A-165D along the X axis. The metal lines 165A-165D can be wider than metal lines in a metal layer (e.g., the metal layer 170 or 180) where all the metal lines are arranged in the same level. In some embodiments, the alignments (or substantial alignments) of the edges of the metal lines 165A-165D may be achieved through DSA, e.g., DSA of a diblock copolymer.

The metal layer 160 is coupled to the metal layer 170 through the vias 150D-150F. The lengths of the vias 150D-150F along the Y axis may be different. For instance, the via 150E may be longer than the via 150D or 150F. In some embodiments, the via 150E and at least a portion of the metal line 160B may be fabricated in a single recess step, in which a metal is provided into an opening to form the via 150E and at least the portion of the metal line 160B. Such a fabrication process may avoid misalignment between the via 150E and the metal line 160B and can achieve seamless contact between the via 150E and the metal line 160B, which can minimize or eliminate interface resistance.

The metal layer 170 includes metal lines 175A-175C. The metal lines 175A-175C are electrically conductive. The metal lines 175A-175C may include one or more metals. A metal in the metal lines 175A-175C may be the same as the metal in one of the metal lines 165A-165D. In the embodiment of FIG. 1, the metal lines 175A-175C are arranged in a same level along the Y axis. The metal lines 175A-175C may be aligned with each other along the X axis. The metal lines 175A-175C may be narrower than the metal lines 165A-165D. In some embodiments, longitudinal axes of the metal lines 175A-175C are in parallel, but the longitudinal axes of the metal lines 175A-175C are not in parallel with longitudinal axes of the metal lines 165A-165D. In an embodiment, the longitudinal axes of the metal lines 175A-175C may be orthogonal (or substantially orthogonal) to the longitudinal axes of the metal lines 165A-165D.

The metal layer 170 is coupled to the metal layer 180 through the vias 150G and 150H. The metal layer 180 incudes metal lines 185A and 1853. The metal lines 185A and 1853 may include one or more metals. A metal in the metal lines 185A and 1853 may be the same as the metal in one of the metal lines 165A-165D. In the embodiment of FIG. 1, the metal lines 185A and 1853 are arranged in a same level along the Y axis. The metal lines 185A and 1853 may be aligned with each other along the X axis. The metal lines 185A and 1853 may be narrower than the metal lines 165A-165D. The metal lines 185A and 1853 may be insulated from each other by the insulative structure 125. In some embodiments, longitudinal axes of the metal lines 185A and 1853 are in parallel, but the longitudinal axes of the metal lines 185A and 1853 are not in parallel with longitudinal axes of the metal lines 175A-175C. In an embodiment, the longitudinal axes of the metal lines 185A and 1853 may be orthogonal (or substantially orthogonal) to the longitudinal axes of the metal lines 175A-175C.

Even though the metal layer 160 in FIG. 1 includes staggered metal lines but the metal layers 170 and 180 does not include staggered metal lines, the metal layer 170 or 180 in other embodiments may include staggered metal lines. Also, the metal layer 160 may include no staggered metal lines. The metal layer 160, 170 or 180 may include a different number of metal lines than the number of metal lines shown in FIG. 1.

Figure 2A:
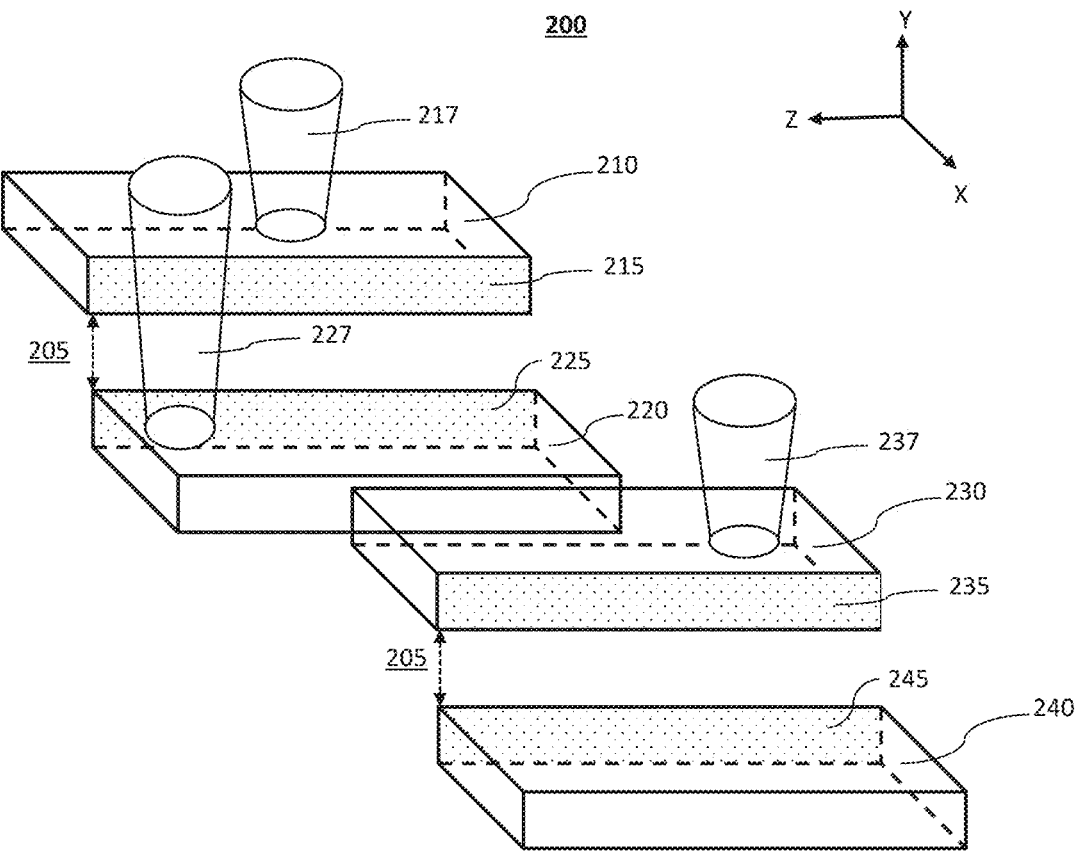
FIGS. 2A-2C illustrate various views of an example metal layer including staggered metal lines, according to some embodiments of the disclosure.
Figure 2B:
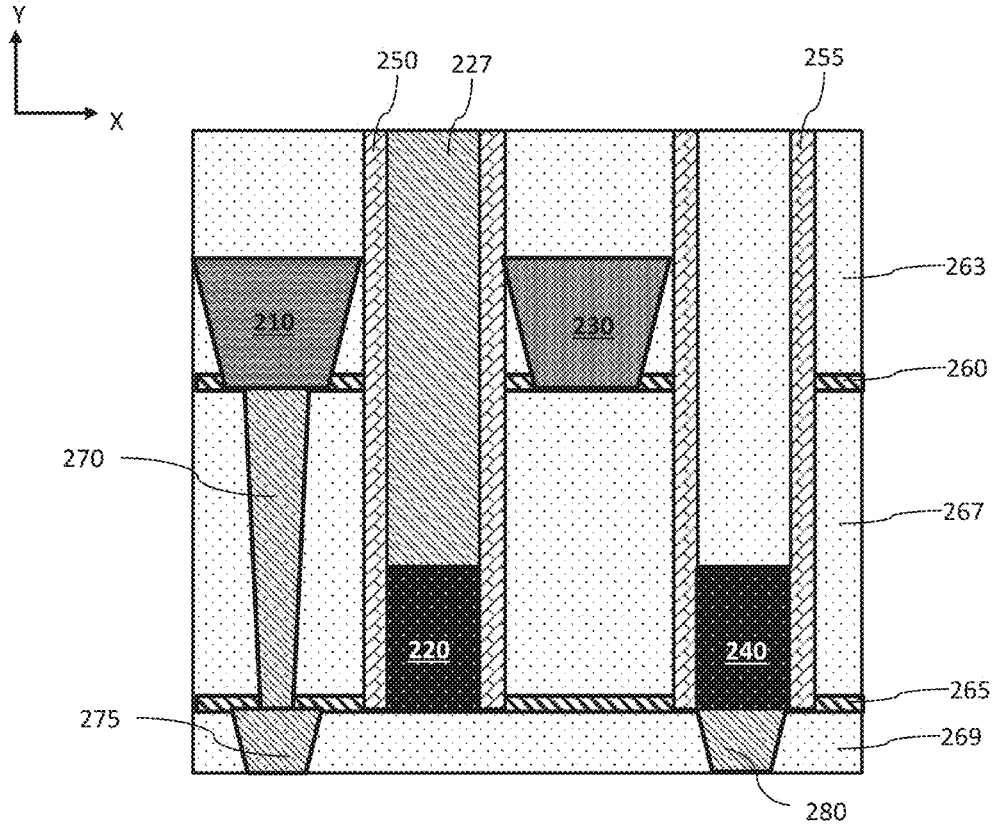
Figure 2C:
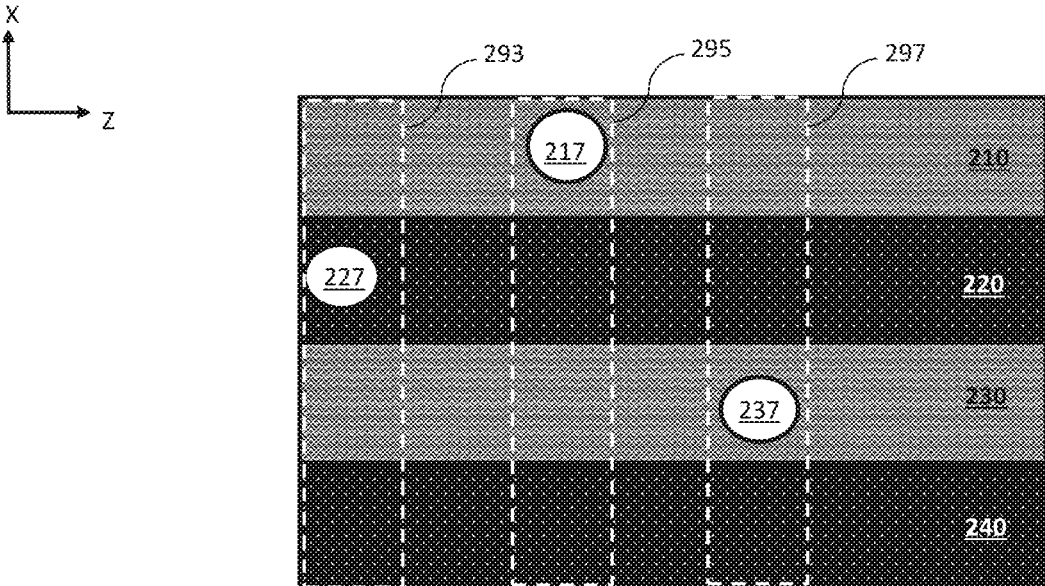

FIGS. 2A-2C illustrate various views of an example metal layer 200 including staggered metal lines 210, 220, 230, and 240, according to some embodiments of the disclosure. FIG. 2A shows a perspective view of the metal layer 200. The metal lines 210, 220, 230, and 240 are in two different levels. As shown in FIG. 2A, the metal lines 210 and 230 are in the same level (the higher level), and the metal lines 220 and 240 are in the same level (the lower level). In other embodiments, the metal layer 200 may include a different number of metal lines, or the metal lines may be in a different number of levels.

There is a distance 205 between the higher level and the lower level in a direction along the Y axis. The distance 205 may indicate a height difference between the metal line 210 (or 230) and the metal line 220 (or 240) in an IC device where the metal layer 200 is located. The metal line 210 (or 230) and the metal line 220 (or 240) can be separated, e.g., by an electrical insulator, in the direction along the Y axis, but may not be separated in a direction along the X axis. A surface 215 of the metal line 210 is aligned (or substantially aligned) with a surface 225 of the metal line 220 along the Y axis. Similarly, a surface 235 of the metal line 230 is aligned (or substantially aligned) with a surface 245 of the metal line 240 along the Y axis. By aligning (or substantially aligning) the surfaces, the widths of the metal lines 210, 220, 230, and 240 along the X axis can be maximized. The surfaces 215, 225, 235, and 245 are marked with dotted patterns in FIG. 2A. The surfaces 215 and 225 are marked with dotted patterns in FIG. 2A.

A via 217 is connected to the metal line 210. In FIG. 2A, the via 217 is on the top surface of the metal line 210. A via 227 is connected to the metal line 220. The via 227 is on the top surface of the metal line 220. Also, a via 237 is connected to the metal line 230. The via 237 is on the top surface of the metal line 230. The vias 217, 227, and 237 may be connected to a metal layer above the metal layer 200 in the IC device. The vias 217 and 237 may have the same length along the Y axis, which is smaller than a length of the via 227 along the Y axis. In FIG. 2A, the vias 217, 227, and 237 are in different Y-Z planes. In other embodiments, some or all of the vias 217, 227, and 237 may be in the same Y-Z plane. Even though FIG. 2A does not show a via connected to the metal line 240, the metal line 240 in other embodiments may be connected to a via. Also, a metal line 210, 220, 230, or 240 may be connected to more than one vias.

FIG. 2B shows a left side view of the metal layer 200. The vias 217 and 237 are invisible in FIG. 2B. FIG. 2B shows an insulator 250 that wraps around the via 227 and the metal line 220 in the X-Y plane and an insulator 255 wraps around the metal line 240 in the X-Y plane. The metal lines 210 and 230 may be formed in an electrical insulator 263. The metal lines 220 and 240 may be formed in an electrical insulator 267. In FIG. 2B, the metal line 210 is connected to a via 270. The via is connected to another via 271. The metal line 240 is connected to a via 280. The via 275 or 280 may be connected to a terminal of a semiconductor device, e.g., the transistor 117 in FIG. 1. The via 270 is formed in the electrical insulator 267, and the vias 275 and 280 is formed in an electrical insulator 269.

FIG. 2B also shows etch stop layers 260 and 265. The etch stop layer 260 is at the bottom of the metal lines 210 and

230. The etch stop layer 265 is at the bottom of the metal lines 220 and 240. In some embodiments, the metal lines 210 and 230 penetrate through the etch stop layer 260, and the metal lines 220 and 240 and the via 270 penetrate through the etch stop layer 265. The etch stop layer 260 or 265 can prevent over etching in the process of forming the metal lines 210, 220, 230, and 240. As an example, a chemical etch may be used to etch through the electrical insulator 263 to form the metal lines 210 and 230. The chemical etch may stop at the etch stop layer 260. A different etch method, e.g., dry etch, may be used to etch through the etch stop layer 260 to avoid damage to the via 270. As another example, a chemical etch may be used to etch through the electrical insulator 267 to form the via 270. The chemical etch may stop at the etch stop layer 265. A different etch method, e.g., dry etch, may be used to etch through the etch stop layer 265 to avoid damage to the via 275. In some embodiments, the etch stop layer 260 or 265 may include silicon nitride, silicon carbide, silicon carbonitride, and so on.

FIG. 2C shows a top view of the metal layer 200. In the top view, there is minimal or even no gaps between the metal lines 210, 220, 230, and 240 in a direction along the X axis. With a predetermined total width of the metal layer 200 along the X axis, the widths of the metal lines 210, 220, 230, and 240 are maximized. FIG. 2C shows three other metal lines 293, 295 and 297. The metal lines 293, 295 and 297 are in another metal layer that is over (e.g., above or below) the metal layer 200. In some embodiments, the metal lines 293, 295 and 297 have a longitudinal axis along the X axis, versus the metal lines 210, 220, 230, and 240 have a longitudinal axis along the Z axis. The metal lines 293, 295 and 297 may be arranged in a same level along the Y axis. There are gaps between the metal lines 293, 295 and 297 so that the metal lines 293, 295 and 297 can be insulated from each other. Given the necessity of these gaps, the widths of the metal lines 293, 295 and 297 may be limited. The metal lines 293, 295 and 297 may be narrower than the metal lines 210, 220, 230, and 240.

Figures 3A, 3B:
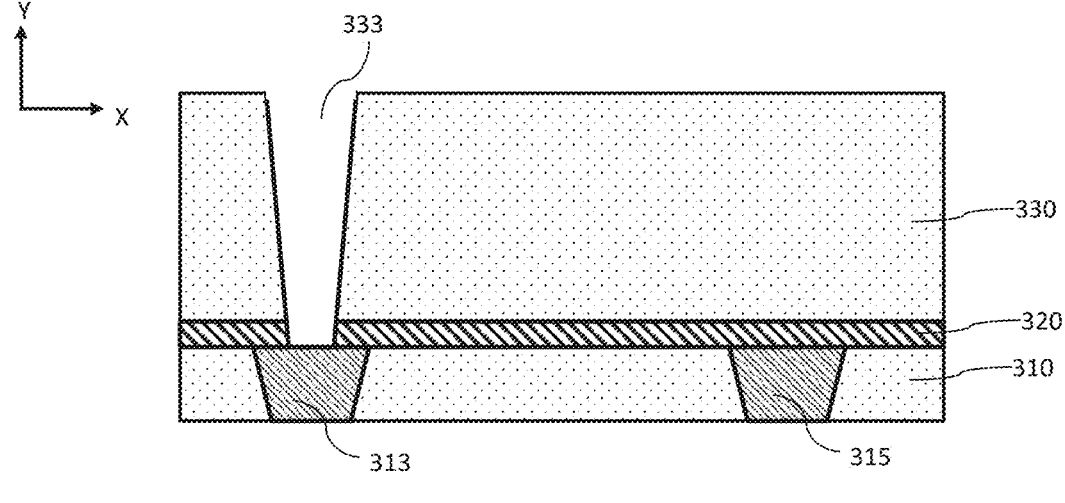
FIGS. 3A and 3B illustrates a process of forming vias for staggered metal lines, according to some embodiments of the disclosure.

FIGS. 3A and 3B illustrates a process of forming vias 313, 315, and 335 for staggered metal lines, according to some embodiments of the disclosure. The vias 313, 315, and 335 are formed through separate patterning processes. The vias 313, 315, and 335 may be embodiments of the vias 275, 280, and 270, respectively, shown in FIG. 2B. FIG. 3A shows a stack of layers 310, 320, and 330. The layer 320 is between the layers 310 and 330. The layers 310 and 330 may be insulative layers. The layer 310 or 330 may include one or more electrical insulators. An electrical insulator may be a dielectric material, hysteretic material, and so on. Example dielectric material includes oxide (e.g., Si based oxides, metal oxides, etc.), low-k dielectric, high-k dielectric, and so on. Example hysteretic material include ferroelectric materials, antiferroelectric materials, etc. The layer 320 may be an etch stop layer. The layer 320 may include silicon nitride, silicon carbide, silicon carbonitride, and so on. In some embodiments, the layer 310, 320, or 330 may be formed through a deposition process. The deposition may be chemical vapor deposition (e.g., plasma enhanced chemical vapor deposition, atomic layer deposition, etc.), physical vapor deposition (e.g., thermal evaporation, etc.) and so on.

The vias 313 and 315 may be formed in the layer 310 through a process that includes patterning, etch, deposition, and polish. The patterning may define locations of the vias 313 and 315. The patterning may also define sizes of the vias 313 and 315. The patterning may be done through lithography, such as photolithography. The etch may form openings in which the vias 313 and 315 can be formed. In some embodiments, a chemical etch may be used to form the openings in the layer 310. A metal may be deposited into the openings. A portion of the deposited metal may be removed by polishing. After The vias 313 and 315 are formed, the layer 320 may be deposited onto the top surface of the layer 310. The layer 330 can be deposited onto the top surface of the layer 320.

In FIG. 3A, an opening 333 is formed in the layers 320 and 330, e.g., through a process including lithography patterning that defines the location and size of the opening 333 and an etching process that forms the opening 333 in accordance with the defined location and size. The etch may include a chemical etch which etches through the layer 330 and a dry etch that etches through the layer 320. The patterning for the opening 333 may be separate from the patterning for the via 313. The two patterning processes may be performed at different times.

In FIG. 3B, the via 335 is formed in the opening 333. The via 335 may be formed through a selective growth of a metal in the opening 333. The metal may be W, Ru, Mo, and so on. In some embodiments, a polish may be performed to remove a portion of the metal that is outside the opening 333. The polishing process may be chemical-mechanical polishing. After the polishing, a layer 340 is formed over the via 335 and the layer 330. The layer 340 may be an etch stop layer.

The vias 313, 315, and 335 constitute two-level vias of the staggered metal lines. The vias 313 and 335 may constitute the first level, and the via 315 may constitute a second level. As shown in FIG. 3B, the via 335 is connected to the via 313. The via 335 may also be connected to a metal line of the staggered metal lines. The via 315 may be connected to another metal line of the staggered metal lines. The two metal lines may be arranged at two different levels along the Y axis. The staggered metal lines may be formed based on the structures shown in FIG. 3B, e.g., through a process illustrated in FIGS. 5A-5X.

Figure 4A:
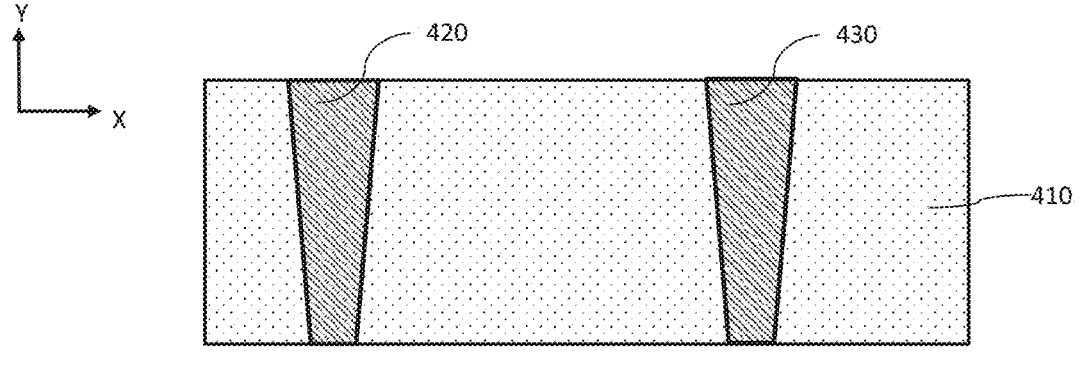
FIGS. 4A-4D illustrates another process of forming vias for staggered metal lines, according to some embodiments of the disclosure.
Figure 4B:
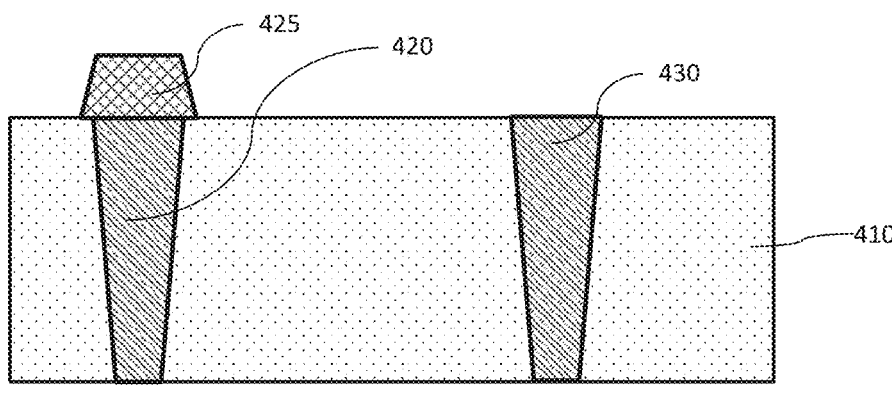

FIGS. 4A and 4B illustrates another process of forming vias 420 and 440 for staggered metal lines, according to some embodiments of the disclosure. In FIG. 4A, two vias 420 and 430 are formed in an insulative layer 410. The insulative layer 410 includes an electrical insulator. The two vias 420 and 430 extends from the top surface of the insulative layer 410 to the bottom surface of the insulative layer 410 along the Y axis. The two vias 420 and 430 may be formed by a process including patterning, etch, metal deposition, and polish. The vias 420 and 430 may each include a metal, e.g., W, Ru, Mo, etc.

Figure 4C:
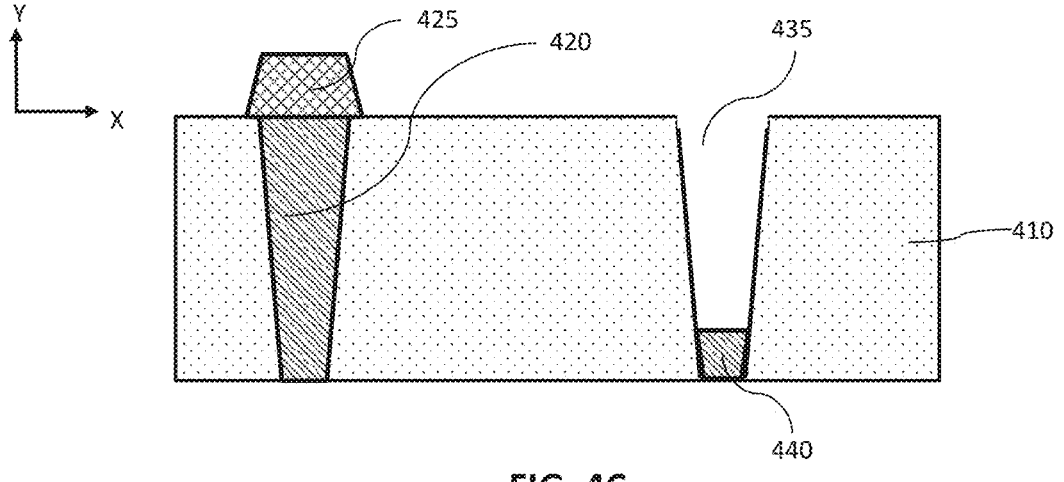
Figure 4D:
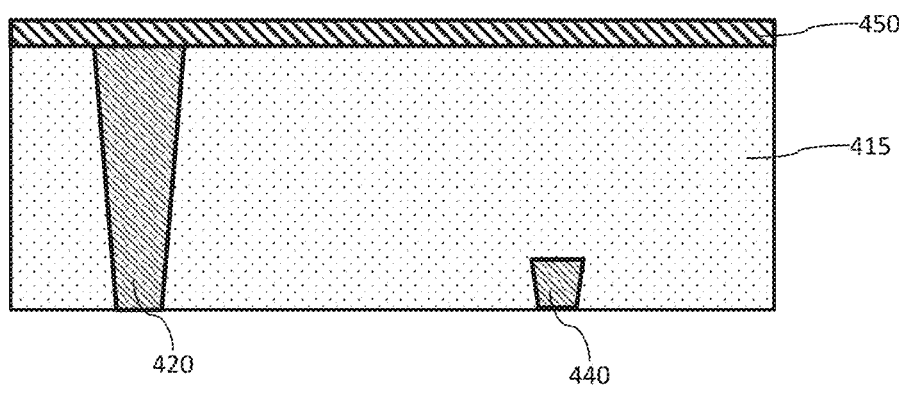

In FIG. 4B, a mask 425 is applied over the via 420. The mask covers the top surface of the via 420. A width of the mask 425 along the X axis may be at least equal to a width of the via 420 along the X axis. The mask 425 may include an oxide or nitride material. In FIG. 4C, the via 430 is recessed, e.g., through a global recess. A new via 440 is formed. The via 440 is a portion of the via 430. The rest of the via 430 is removed during the recess, which forms an opening 435 in the insulative layer 410. In FIG. 4D, the mask 425 is removed, e.g., through etch or polish. The opening 435 is filled with an electrical insulator, e.g., the electrical insulator in the insulative layer 410 or a different electrical insulator. A new insulative layer 415 is formed. The opening 435 may be filled through an inter-layer deposition process. Also, a layer 450 is formed over the via 420 and the insulative layer 415. The layer 450 may be an etch stop layer.

The vias 420 and 440 constitute two-level vias of the staggered metal lines. The via 420 may be connected to a metal line in a first level of the staggered metal lines. The via 430 may be connected to a metal line in a second level of the staggered metal lines. The first level is over the second level. The staggered metal lines may be formed based on the structures shown in FIG. 4D, e.g., through a process illustrated in FIGS. 5A-5X.

Figure 5A:
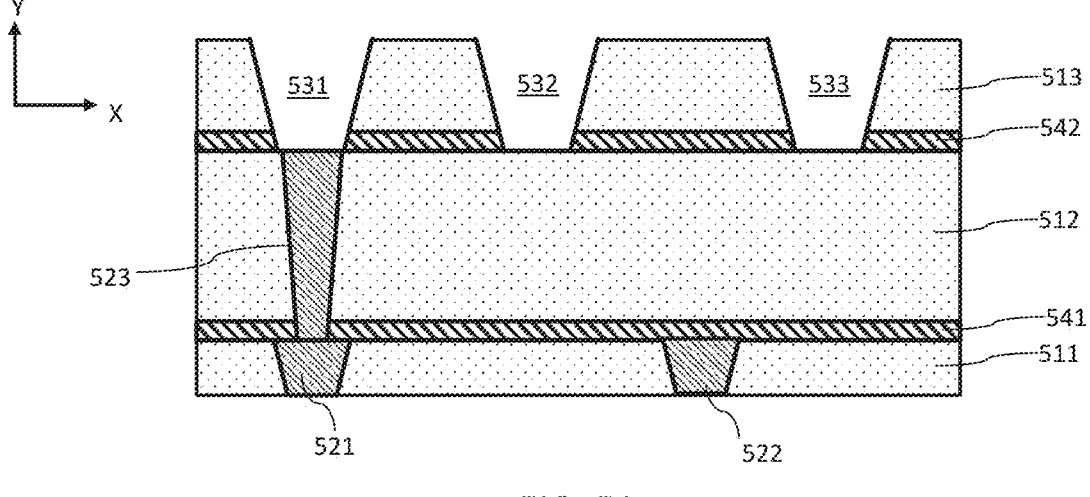
FIGS. 5A-5W illustrate a process of forming staggered metal lines, according to some embodiments of the disclosure.
Figure 5B:
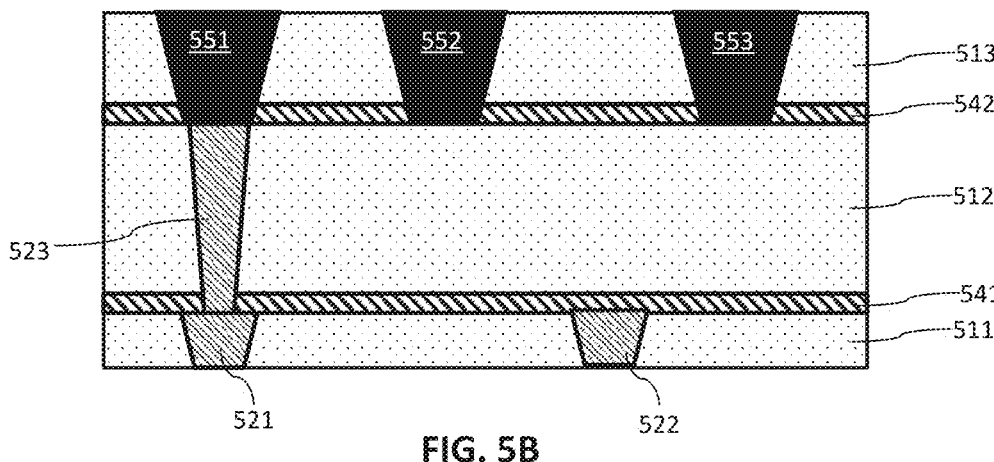
Figures 5C, 5D:
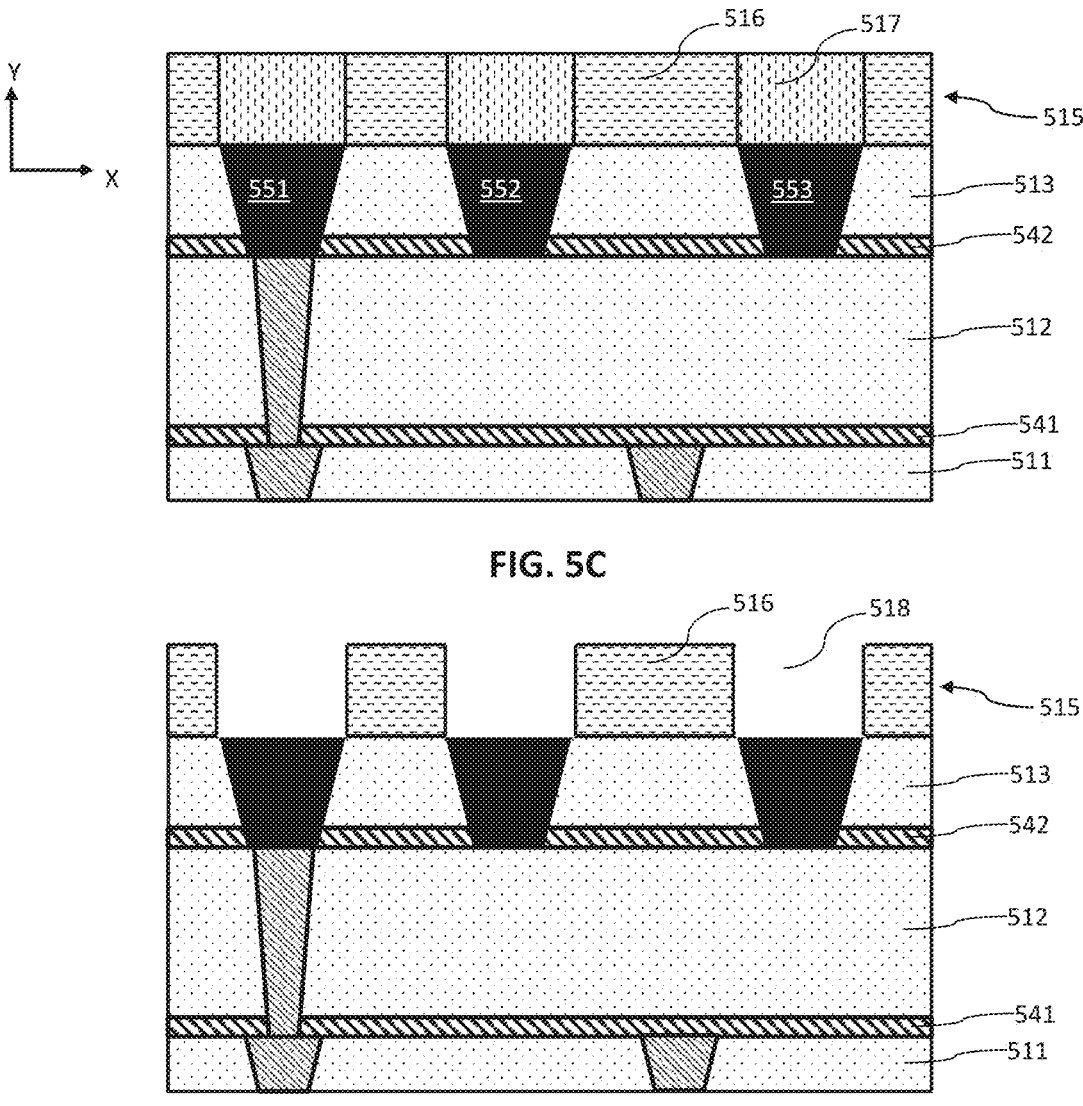
Figure 5E:
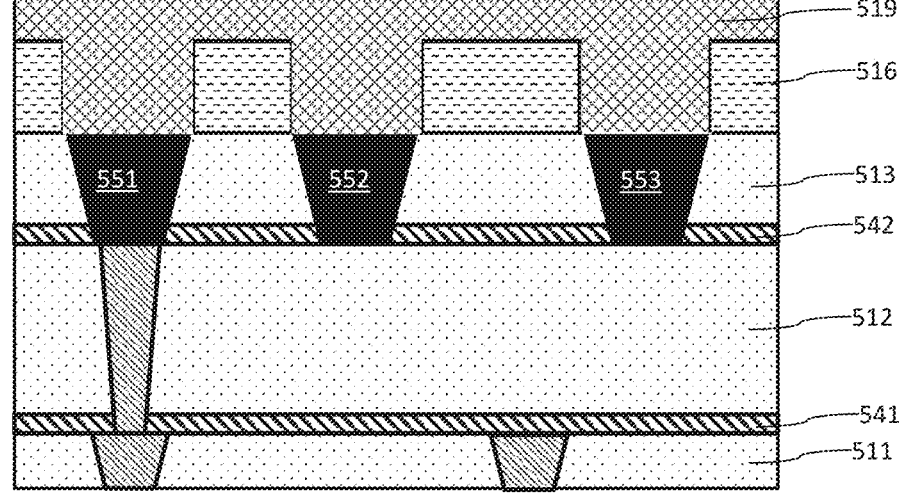
Figure 5F:
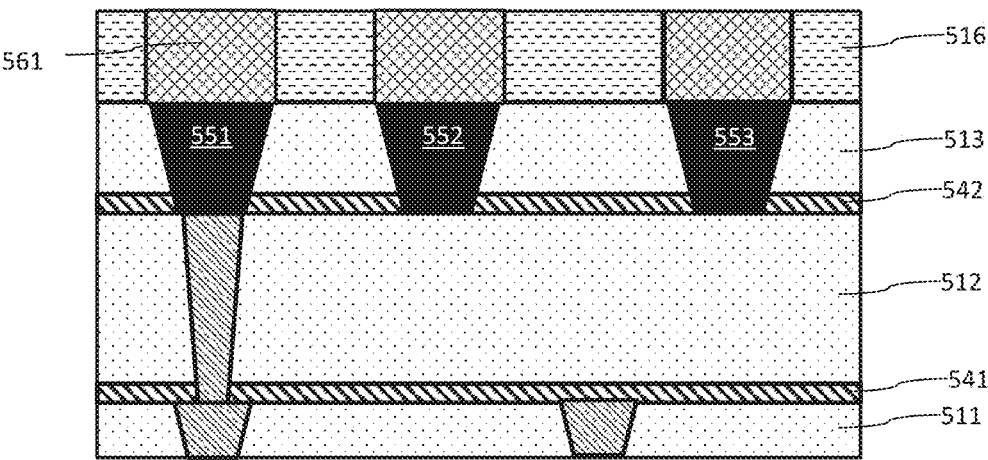
Figure 5H:
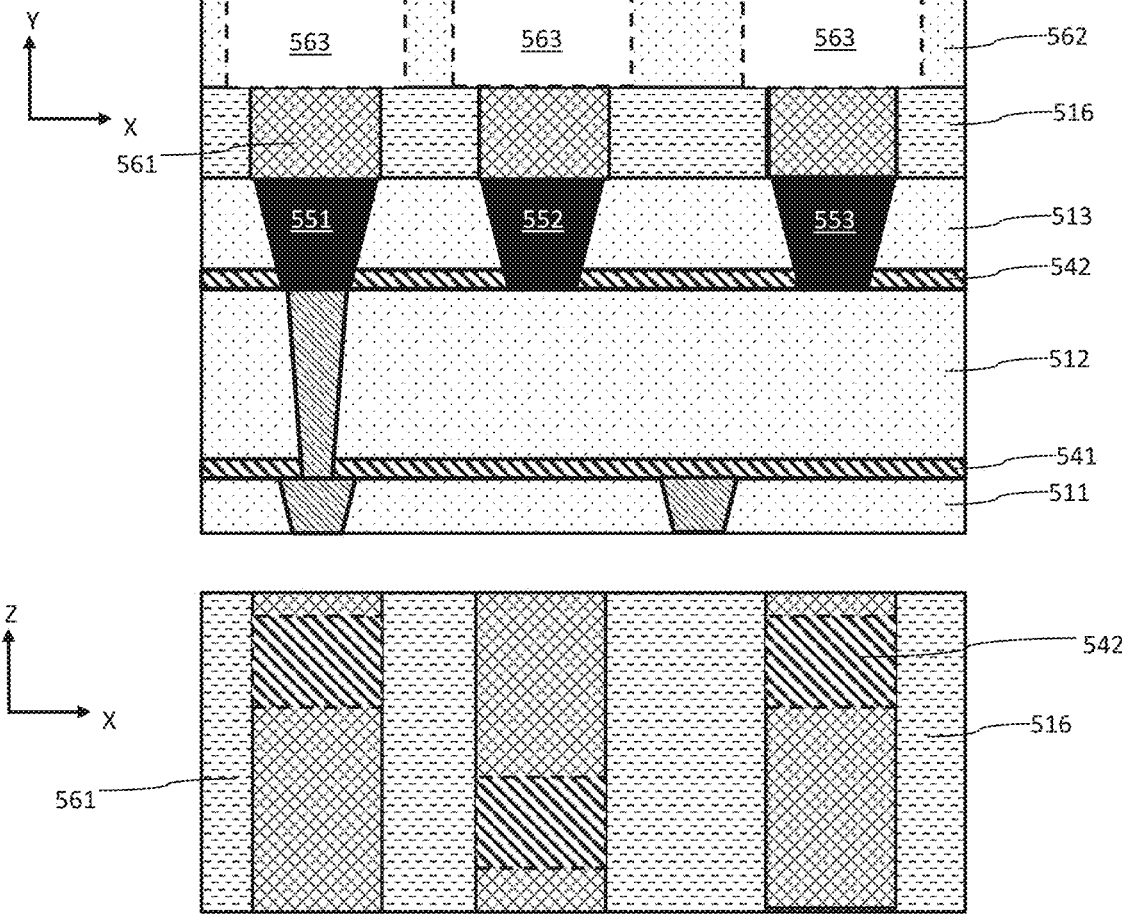
Figures 5I, 5J:
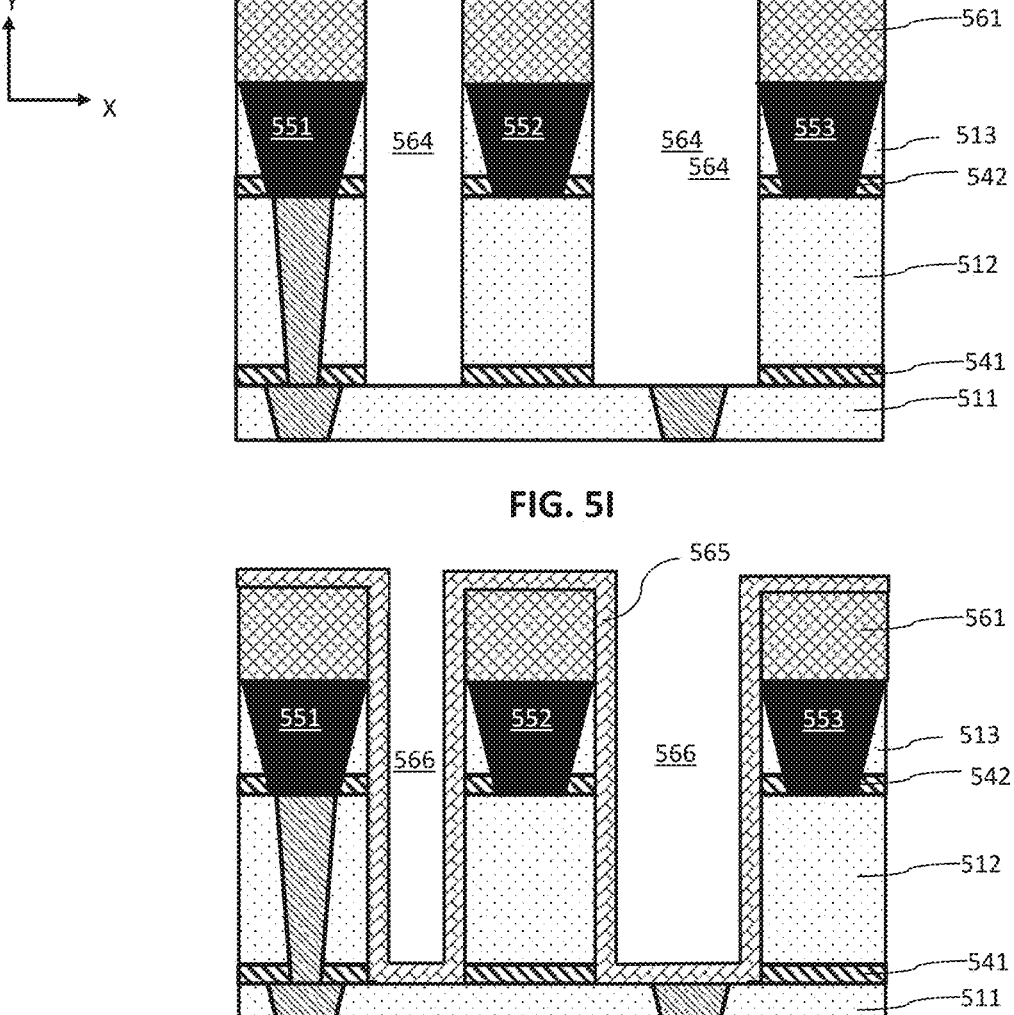
Figure 5K:
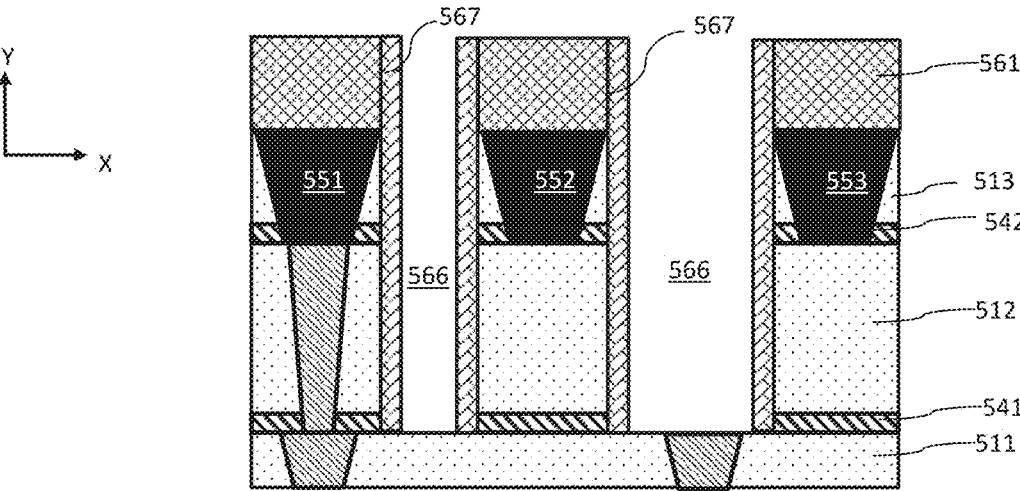
Figure 5L:
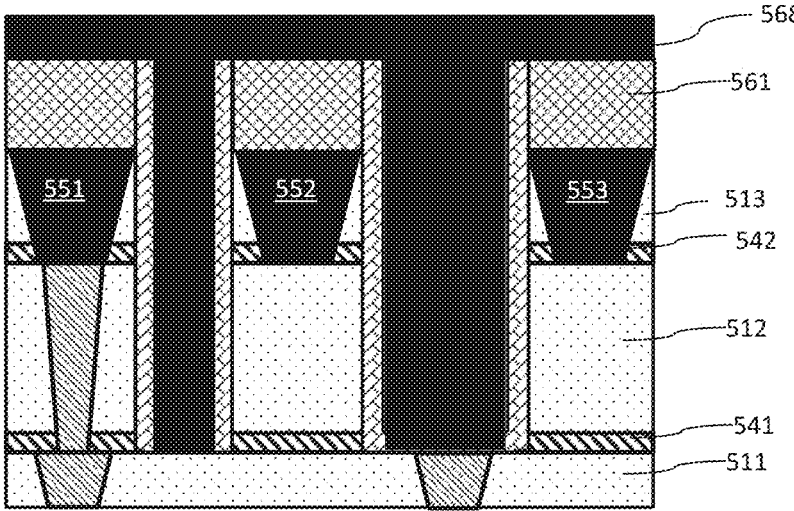
Figure 5P:
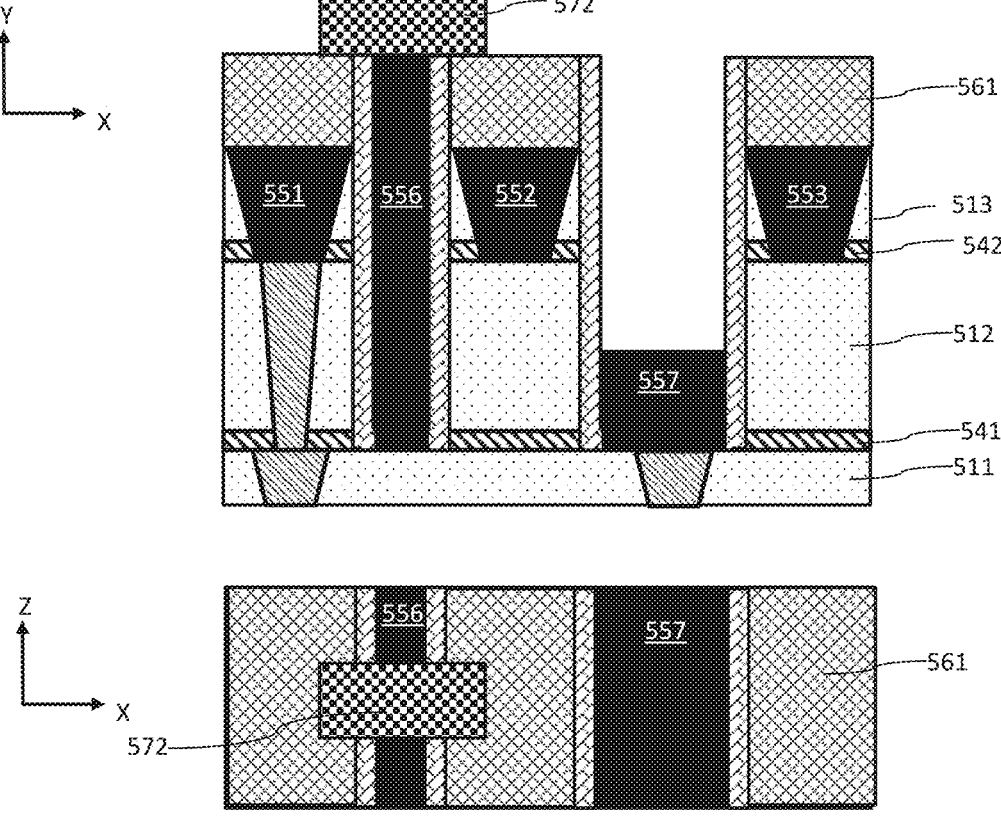
Figure 5Q:
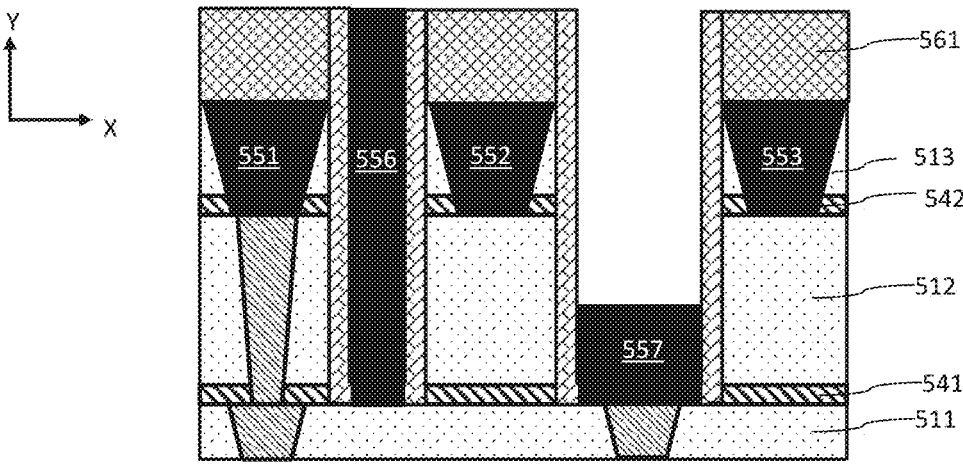
Figure 5R:
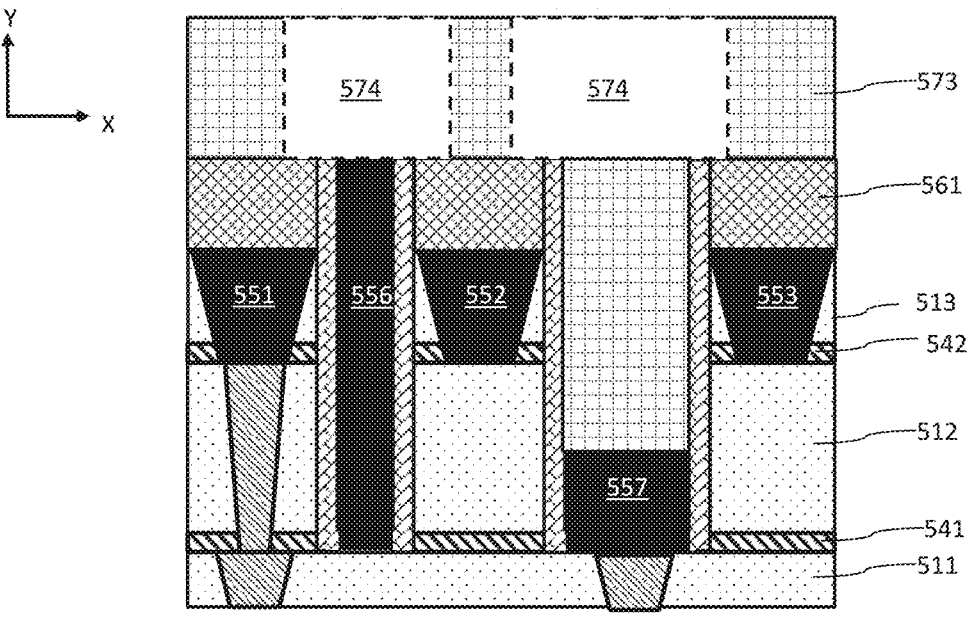
Figure 5S:
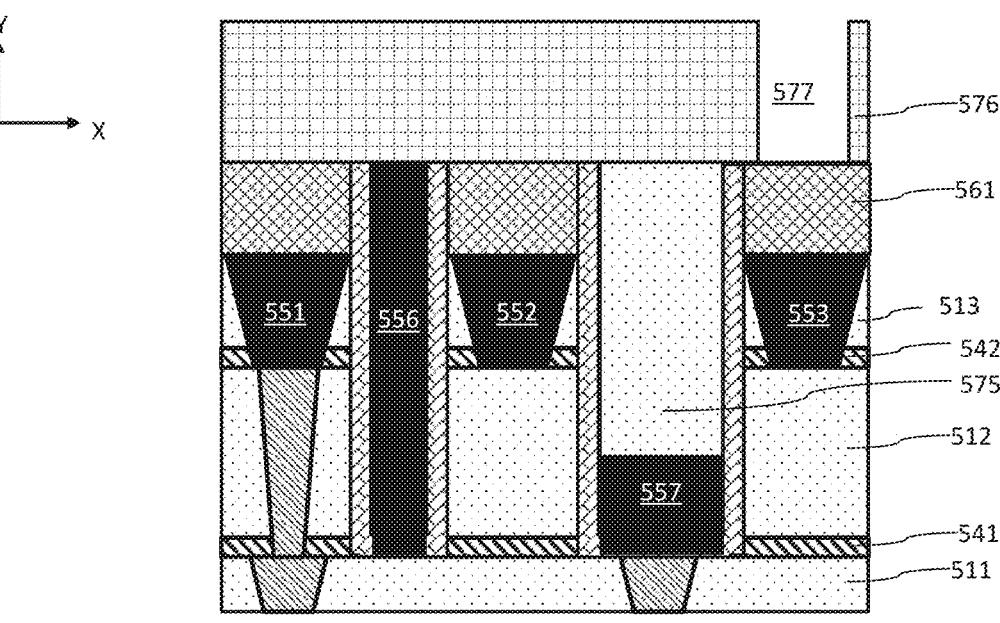
Figure 5U:
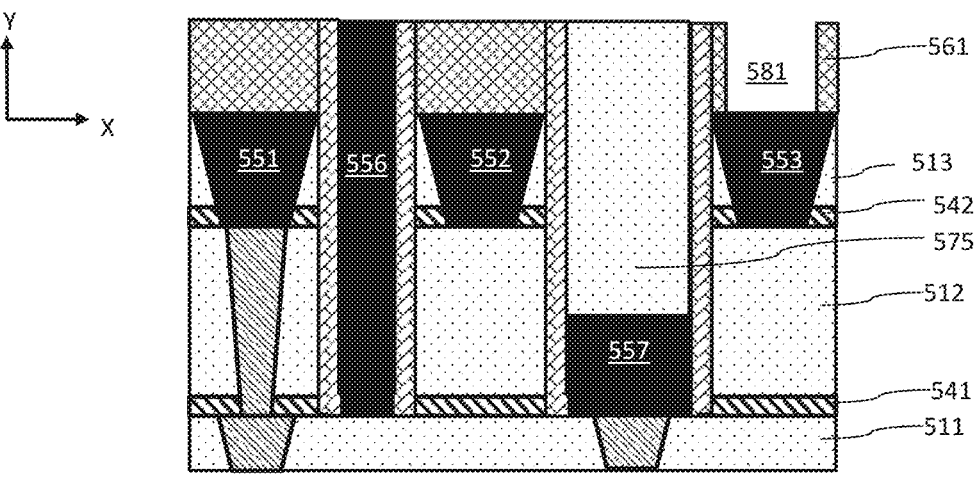
Figure 5V:
Figure 5W:
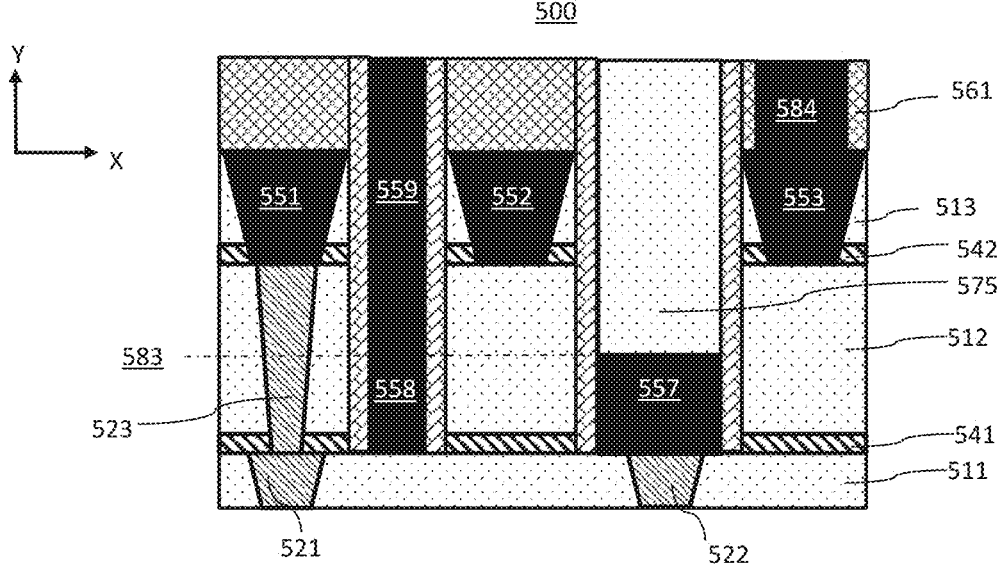

FIGS. 5A-5W illustrate a process of forming staggered metal lines, according to some embodiments of the disclosure. The process may be performed after the process in FIGS. 3A and 3B or after the process in FIGS. 4A-4D. The staggered metal lines may constitute a metal layer, e.g., the metal layer 160 in FIG. 1 or the metal layer 200 in FIG. 2.

FIG. 5A shows three insulative layers 511, 512, and 513. Vias 521 and 522 are formed in the insulative layer 511. A via 523 is formed in the insulative layer 512. Openings 531, 532, and 533 are formed in the insulative layer 513. FIG. 5A also shows etch stop layers 541 and 542. The insulative layers 511, 512, and 513 and etch stop layers 541 and 542 may be formed through deposition. The deposition may be chemical vapor deposition (e.g., plasma enhanced chemical vapor deposition, atomic layer deposition, etc.), physical vapor deposition (e.g., thermal evaporation, etc.) and so on. The vias 521, 522, and 523 may be formed through patterning, etch, deposition, and polish. The openings 531, 532, and 533 may be formed through patterning and etch. Each of the openings 531, 532, and 533 extend through the insulative layer 513 and the etch stop layer 542.

In FIG. 5B, metal lines 551, 552, and 553 are formed in the openings 531, 532, and 533. The metal line 551 is connected with the via 523. In the embodiment of FIG. 5B, the metal lines 551, 552, and 553 may be formed by a damascene process. The damascene process may include deposition of a metal into the openings 531, 532, and 533. In other embodiments, the metal lines 551, 552, and 553 may be formed by a subtractive process. The subtractive process may include forming a metal layer, following by etching the metal layer to form openings, and fill the openings with an electrical insulator to form the insulative layer 513. The metal lines 551, 552, and 553 are in a same level of the metal layer. In some embodiments, the metal lines 551, 552, and 553 includes a metal, e.g., Ru or W.

In FIG. 5C, a layer 515 is formed. The layer 515 has an alternating pattern in which structures 516 (individually referred to as "structure 516") alternatives with structures 517 (individually referred to as "structure 517"). The structures 516 and 517 may include two different polymers. In some embodiments, the layer 515 may be formed through DSA of a diblock copolymer. The diblock copolymer includes two types of monomers A and B. The diblock copolymer may have a phase (e.g., a lamellar phase) that has a periodic distribution of A and B. In the embodiment of FIG. 5C, the structures 516 include one of the monomers, and the structurers 517 include the other monomer. In an example, the structures 516 include polystyrene (PS), and the structures 517 include poly(methyl methacrylate) (PMMA).

In FIG. 5D, the structures 517 are removed, and openings 518 are formed in the layer 515. The structures 516 are still in the layer 515. The structures 517 may be removed by selective etching.

In FIG. 5E, a hard mask material 519 is added. Some portions of the hard mask material 519 fills the openings 518 and another portion of the hard mask material 519 is over the structures 516. The hard mask material 519 may be a material that can resist etch. Examples of the hard mask material 519 may include silicon dioxide, titanium nitride, amorphous carbon tantalum nitride, silicon nitride, cobalt, manganese oxide, and so on. In FIG. 5F, a part of the hard mask material 519 is removed, e.g., by polishing, and structures 561 (individually referred to as "structure 561") are formed between the structures 516. The structures 561 may function as protective caps of the metal lines 551, 552, and 553. In some embodiments, the structures 561 may define a height of an insulative layer between the metal layer including the staggered metal lines and the next metal layer.

FIG. 5G shows a front view in the X-Y plan and a top view in the X-Z plane. In FIG. 5G, a layer 562 is formed over the structures 516 and 561. The layer 562 is formed with openings 563. The openings 563 may be out of the X-Y plane of the front view, the openings 563 are represented by dashed boxes in FIG. 5G. end-to-end of the metal lines 551, 552, and 553 are formed by forming openings in the structures 561, e.g., through etch or recess.

In FIG. 5H, portions of the structures 561, which are under the openings 563, are etched to form openings in the structures 561. The openings constitute end-to-end of the metal lines 551, 552, and 553. FIG. 5H shows a front view in the X-Y plan and a top view in the X-Z plane. The etch is stopped at the etch stop layer 542 and therefore, portions of the etch stop layer 542 are exposed, which is shown in the top view. After the end-to-end formation, the layer 562 may be removed, e.g., through polish. The openings in the structures 561 may be filled with a dielectric material, e.g., through inter-layer deposition. The dielectric material may be a low-k material. In some embodiments, the deposition may be followed by polish, e.g., chemical-mechanical polish to remove the dielectric material deposited outside the openings. The openings may then be filled with the dielectric material.

In FIG. 5I, the structures 516 are removed, e.g., through selective etch. Also, portions of the layers 513, 542, 512, and 541, which are under the structures 516, are removed. Openings 564 (individually referred to as "opening 564") are formed. In some embodiments, the removal of the structures 516 and the portions of the layers 513, 542, 512, and 541 may be done through a combination of different etching processes. In an example, the structures 516 and the portions of the layers 513, and 512 may be removed through chemical etch, and the portions of the layers 542 and 541 may be removed through dry etch. As the structures 516 and 517 are self-aligned, the self-alignment is inherited by the structures 561 and openings 564. In some embodiments, the structures 561 have the same or similar size, and the openings 564 have the same or similar size.

In FIG. 5J, a coating 565 is formed. The coating 565 may be formed through depositing a dielectric material. The dielectric material may be a high-k material, such as silicon nitride. The coating 565 may be insulative and can prevent via shorting. The coating 565 are on the surfaces (e.g., side surfaces and bottom surfaces) of the openings 564 and on top surfaces of the structure 561. The openings 564 are converted to openings 566 (individually referred to as "opening 566").

In FIG. 5K, some portions of the coating 565 are removed, e.g., the portions that cover the top surfaces of the structures 561 and the portions that cover the bottom surfaces of the openings 656. As shown in FIG. 5K, spacers 567 are formed. The spacers 567 are on side walls of the openings 566.

In FIG. 5L, a metal 568 is added, e.g., through a deposition process or a subtractive process. Some portions of the metal 568 fill the openings 566, and the rest of the metal 568 are outside the openings 566. The metal may be the same metal in the metal lines 551, 552, and 553. In FIG. 5M, certain portions of the metal 568 is removed, e.g., the portions that are outside the openings 566. As a result, metal structures 554 and 555 are formed.

In FIG. 5N, a layer 569 is formed. The layer 569 may include an oxide or nitride material. In FIG. 5O, an opening 571 is formed in the layer 569. The layer 569 may constitute a mask. FIG. 5O shows a front view in the X-Y plane and a top view in the X-Z plane.

FIG. 5P also shows a front view in the X-Y plane and a top view in the X-Z plane. In FIG. 5P, a structure 572 is formed in the opening 571, and the layer 569 is removed. The structure 572 may function as a hard mask. The structure 572 may include an oxide or nitride material, such as silicon nitride, silicon oxide, etc. Additionally, a recessing process is performed to remove portions of the metal structures 554 and 554 that are not covered by the structure 572. A new metal structure 556 and a metal line 557 are formed. In FIG. 5Q, the structure 572 is removed, e.g., through etch or polish.

In FIG. 5R, end-to-end for the metal structure 556 and metal line 557 are formed. A layer 573 is formed with openings 574. The layer 573 may be the same or similar to the layer 562 in FIG. 5H. For instance, the layer 573 may include a material in the layer 562 and may be formed using the same process as forming the layer 562. This end-to-end formation process may be similar to the end-to-end formation process described above in conjunction with FIG. 5H. In FIG. 5U, the end-to-end formation process is finished. An insulative structure 575 is formed over the metal line 557. The insulative structure 575 may include an electrical insulator. The insulative structure 575 may be formed through inter-layer deposition. In some embodiment, a polish (e.g., chemical-mechanical polish) may be done after the deposition to remove extra portions of the deposited electrical insulator to form the insulative structure 575.

In FIG. 5S, a layer 576 is formed over the structures 561, the metal structure 556, and the insulative structure 575. The layer 576 is formed with an opening 577. The opening 577 may be formed through patterning and etching. In FIG. 5T, further etching is performed to expand the opening 577 to an opening 578. A portion of the structure 561 under the opening 577 is removed. The structure 561 over the metal line 553 is converted to a structure 579. In FIG. 5U, the layer 576 is removed, and an opening 581 is formed. The opening 581 is a portion of the opening 578.

In FIG. 5V, a metal 582 is added, e.g., through deposition. The deposition may be chemical vapor deposition (e.g., plasma enhanced chemical vapor deposition, atomic layer deposition, etc.), physical vapor deposition (e.g., thermal evaporation, etc.) and so on. A portion of the metal 582 fills the opening 581, and the rest of the metal 582 is outside the opening 581. The metal 582 may be Ru or W. In FIG. 5W, the portion the metal 582 that is outside the opening 581 is removed, which forms a via 584 that is connected to the metal line 553. Even though not shown in FIG. 5V, the structures 561 may be removed and replaced with a dielectric material, such as a low-k dielectric material. The dielectric material may be added through an inter-layer deposition.

An IC device 500 is formed after the process in FIG. 5W is done. The IC device 500 includes a metal layer that includes two-level staggered metal lines. The staged metal lines include the metal lines 551, 552, and 553, which are in the higher level of the metal layer. The staged metal lines also include two more metal lines: the metal line 557 and a metal line 558, which are in the lower level of the metal layer. The metal line 558 is a portion of the metal structure 556, i.e., the portion under the line 583. The line 583 may be a surface in the X-Z plane. The line 583 may be defined by the top surface of the metal line 557. The other portion of the metal structure 556, i.e., the portion above the line 583, constitute a via 559, which can be connected to another metal layer. The via 584 may also be connected to the other metal layer. The separation of the two levels can reduce parasitic capacitance in the metal layer. As the via 559 and the metal line 558 are formed in the same recess, the contact between the via 559 and the metal line 558 can be seamless, and interface resistance can be minimized or even eliminated. Also, registration shift between the via 559 and the metal line 558 can be minimized or even eliminated.

The process in FIGS. 5A-5W can also maximize widths of the metal lines 551, 552, 553, 557, and 558 along the X axis. As described above, the alignment of the metal lines 551, 552, 553, 557, and 558 along the X axis is determined by the alignment of the structures 516 and 517 in the layer 515, which has an alternative pattern of the structures 516 and 517 that is defined by the DSA of the diblock copolymer. By using the DSA of the diblock copolymer, the widths of the metal lines 551, 552, 553, 557, and 558 can be maximized. With the maximized widths of the metal lines 551, 552, 553, 557, and 558, the placement of vias (e.g., the vias 522, 523, and 584) on the metal lines 551, 552, 553, 557, and 558 can be easier compared with conventionally available metal lines that are arranged in the same level. The self-alignment can delay width scaling of the metal lines 551, 552, 553, 557, and 558 as cell height scales. The self-alignment can also eliminate the need of tight end-to-end control between metal lines and via to metal lines.

As the metal lines 553 and 558 are in different levels, the vias 559 and 584 have different lengths along the Y axis, the via 559 is longer. Also, as the metal lines 551 and 557 are in different levels, the metal line 551 is connected to the via 523, which is further connected to the via 521, and the metal line 557 is connected to the via 522. Thus, the metal lines 551, 552, 553, 557, and 558 are associated with two-level vias both above and below them.

FIGS. 6A-6B are top views of a wafer 2000 and dies 2002 that may include one or more varactor devices with backside electrical contact, according to some embodiments of the disclosure. In some embodiments, the dies 2002 may be included in an IC package, according to some embodiments of the disclosure. For example, any of the dies 2002 may serve as any of the dies 2256 in an IC package 2200 shown in FIG. 7. The wafer 2000 may be composed of semiconductor material and may include one or more dies 2002 having IC devices formed on a surface of the wafer 2000. Each of the dies 2002 may be a repeating unit of a semiconductor product that includes any suitable IC (e.g., ICs including one or more varactor devices as described herein). After the fabrication of the semiconductor product is complete (e.g., after manufacture of one or more varactor devices as described herein), the wafer 2000 may undergo a singulation process in which each of the dies 2002 is separated from one another to provide discrete "chips" of the semiconductor product. In particular, devices that include one or more varactor devices as disclosed herein may take the form of the wafer 2000 (e.g., not singulated) or the form of the die 2002 (e.g., singulated). The die 2002 may include one or more diodes (e.g., one or more varactor devices as described herein), one or more transistors (e.g., one or more III-N transistors as described herein) as well as, optionally, supporting circuitry to route electrical signals to the III-N diodes with n-doped wells and capping layers and III-N transistors, as well as any other IC components. In some embodiments, the wafer 2000 or the die 2002 may implement an electrostatic discharge (ESD) protection device, a radio frequency front-end device, a memory device (e.g., a static random-access memory (SRAM) device), a logic device (e.g., an AND, OR, NAND, or NOR gate), or any other suitable circuit element. Multiple ones of these devices may be combined on a single die 2002.

Figure 7:
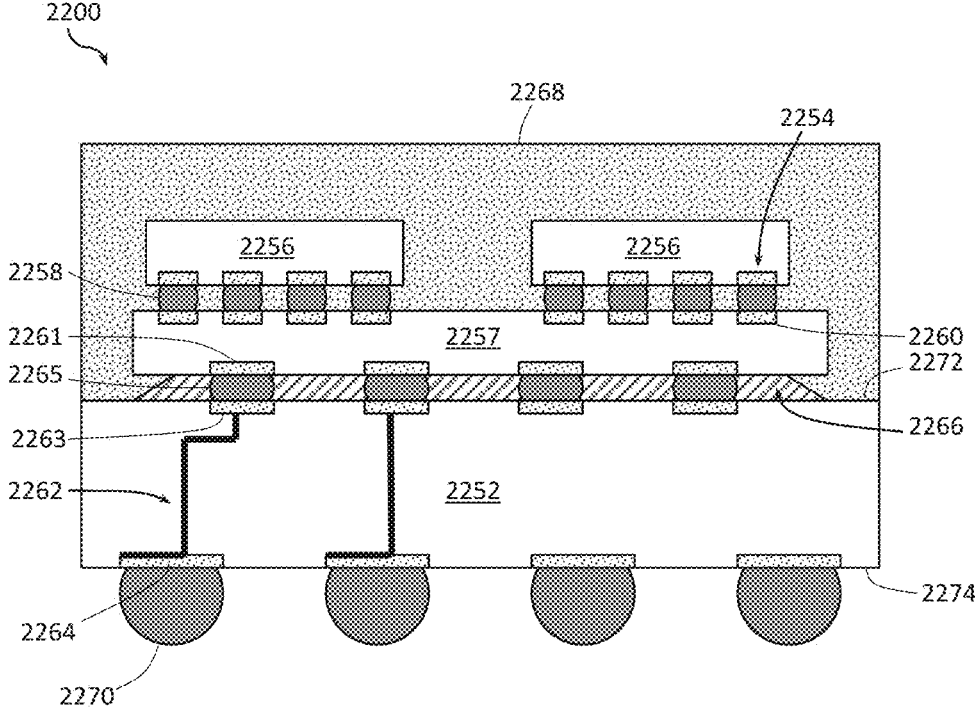
FIG. 7 is a side, cross-sectional view of an example IC package that may include one or more IC devices having varactor devices with backside electrical contact, according to some embodiments of the disclosure.

FIG. 7 is a side, cross-sectional view of an example IC package 2200 that may include one or more IC devices having varactor devices with backside electrical contact, according to some embodiments of the disclosure. In some embodiments, the IC package 2200 may be a system-in-package (SiP).

As shown in FIG. 7, the IC package 2200 may include a package substrate 2252. The package substrate 2252 may be formed of a dielectric material (e.g., a ceramic, a glass, a combination of organic and inorganic materials, a buildup film, an epoxy film having filler particles therein, etc., and may have embedded portions having different materials), and may have conductive pathways extending through the dielectric material between the face 2272 and the face 2274, or between different locations on the face 2272, and/or between different locations on the face 2274.

The package substrate 2252 may include conductive contacts 2263 that are coupled to conductive pathways 2262 through the package substrate 2252, allowing circuitry within the dies 2256 and/or the interposer 2257 to electrically couple to various ones of the conductive contacts 2264 (or to other devices included in the package substrate 2252, not shown).

The IC package 2200 may include an interposer 2257 coupled to the package substrate 2252 via conductive contacts 2261 of the interposer 2257, first-level interconnects 2265, and the conductive contacts 2263 of the package substrate 2252. The first-level interconnects 2265 illustrated in FIG. 7 are solder bumps, but any suitable first-level interconnects 2265 may be used. In some embodiments, no interposer 2257 may be included in the IC package 2200; instead, the dies 2256 may be coupled directly to the conductive contacts 2263 at the face 2272 by first-level interconnects 2265.

The IC package 2200 may include one or more dies 2256 coupled to the interposer 2257 via conductive contacts 2254 of the dies 2256, first-level interconnects 2258, and conductive contacts 2260 of the interposer 2257. The conductive contacts 2260 may be coupled to conductive pathways (not shown) through the interposer 2257, allowing circuitry within the dies 2256 to electrically couple to various ones of the conductive contacts 2261 (or to other devices included in the interposer 2257, not shown). The first-level interconnects 2258 illustrated in FIG. 7 are solder bumps, but any suitable first-level interconnects 2258 may be used. As used herein, a "conductive contact" may refer to a portion of electrically conductive material (e.g., metal) serving as an interface between different components; conductive contacts may be recessed in, flush with, or extending away from a surface of a component, and may take any suitable form (e.g., a conductive pad or socket).

In some embodiments, an underfill material 2266 may be disposed between the package substrate 2252 and the interposer 2257 around the first-level interconnects 2265, and a mold compound 2268 may be disposed around the dies 2256 and the interposer 2257 and in contact with the package substrate 2252. In some embodiments, the underfill material 2266 may be the same as the mold compound 2268. Example materials that may be used for the underfill material 2266 and the mold compound 2268 are epoxy mold materials, as suitable. Second-level interconnects 2270 may be coupled to the conductive contacts 2264. The second-level interconnects 2270 illustrated in FIG. 7 are solder balls (e.g., for a ball grid array arrangement), but any suitable second-level interconnects 22770 may be used (e.g., pins in a pin grid array arrangement or lands in a land grid array arrangement). The second-level interconnects 2270 may be used to couple the IC package 2200 to another component, such as a circuit board (e.g., a motherboard), an interposer, or another IC package, as known in the art and as discussed below with reference to FIG. 8.

The dies 2256 may take the form of any of the embodiments of the die 2002 discussed herein and may include any of the embodiments of an IC device having one or more varactor devices. In embodiments in which the IC package 2200 includes multiple dies 2256, the IC package 2200 may be referred to as a multi-chip package. Importantly, even in such embodiments of an MCP implementation of the IC package 2200, one or more varactor devices may be provided in a single chip, in accordance with any of the embodiments described herein. The dies 2256 may include circuitry to perform any desired functionality. For example, one or more of the dies 2256 may be ESD protection dies, including one or more varactor devices as described herein, one or more of the dies 2256 may be logic dies (e.g., silicon-based dies), one or more of the dies 2256 may be memory dies (e.g., high bandwidth memory), etc. In some embodiments, any of the dies 2256 may include one or more varactor devices, e.g., as discussed above; in some embodiments, at least some of the dies 2256 may not include any III-N diodes with n-doped wells and capping layers.

The IC package 2200 illustrated in FIG. 7 may be a flip chip package, although other package architectures may be used. For example, the IC package 2200 may be a ball grid array (BGA) package, such as an embedded wafer-level ball grid array (eWLB) package. In another example, the IC package 2200 may be a wafer-level chip scale package (WLCSP) or a panel fan-out (FO) package. Although two dies 2256 are illustrated in the IC package 2200 of FIG. 7, an IC package 2200 may include any desired number of the dies 2256. An IC package 2200 may include additional passive components, such as surface-mount resistors, capacitors, and inductors disposed on the first face 2272 or the second face 2274 of the package substrate 2252, or on either face of the interposer 2257. More generally, an IC package 2200 may include any other active or passive components known in the art.

Figure 8:
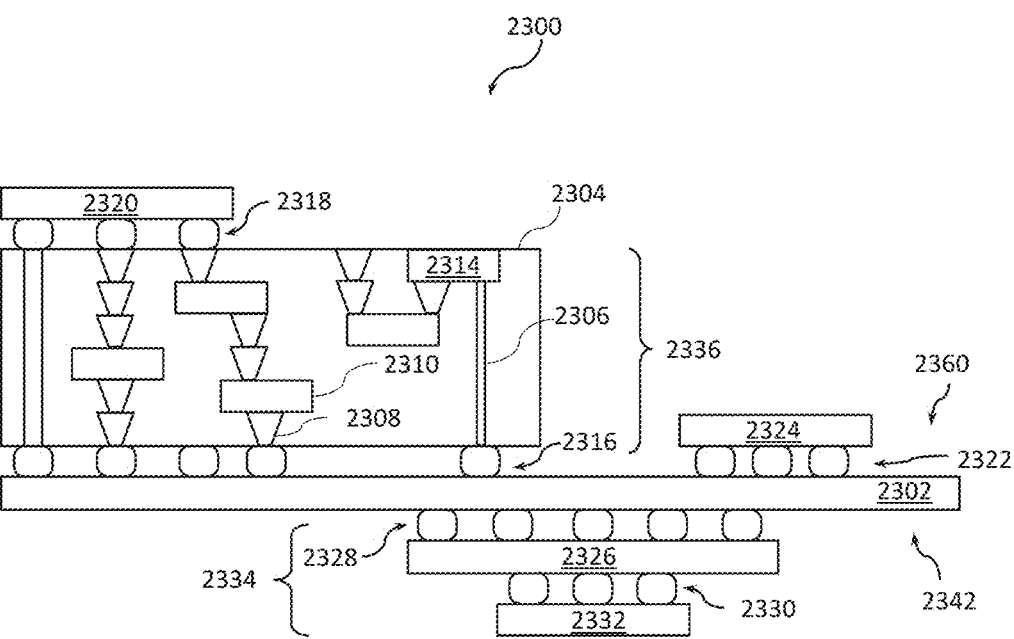
FIG. 8 is a cross-sectional side view of an IC device assembly that may include components having one or more IC devices implementing varactor devices with backside electrical contact, according to some embodiments of the disclosure.

FIG. 8 is a cross-sectional side view of an IC device assembly 2300 that may include components having one or more IC devices implementing varactor devices with backside electrical contact, according to some embodiments of the disclosure. The IC device assembly 2300 includes a number of components disposed on a circuit board 2302 (which may be, e.g., a motherboard). The IC device assembly 2300 includes components disposed on a first face 2340 of the circuit board 2302 and an opposing second face 2342 of the circuit board 2302; generally, components may be disposed on one or both faces 2340 and 2342. In particular, any suitable ones of the components of the IC device assembly 2300 may include any of the IC devices implementing one or more varactor devices in accordance with any of the embodiments disclosed herein; e.g., any of the IC packages discussed below with reference to the IC device assembly 2300 may take the form of any of the embodiments of the IC package 2200 discussed above with reference to FIG. 7 (e.g., may include one or more varactor devices in/on a die 2256).

In some embodiments, the circuit board 2302 may be a PCB including multiple metal layers separated from one another by layers of dielectric material and interconnected by electrically conductive vias. Any one or more of the metal layers may be formed in a desired circuit pattern to route electrical signals (optionally in conjunction with other metal layers) between the components coupled to the circuit board 2302. In other embodiments, the circuit board 2302 may be a non-PCB substrate.

The IC device assembly 2300 illustrated in FIG. 8 includes a package-on-interposer structure 2336 coupled to the first face 2340 of the circuit board 2302 by coupling components 2316. The coupling components 2316 may electrically and mechanically couple the package-on-interposer structure 2336 to the circuit board 2302, and may include solder balls (e.g., as shown in FIG. 8), male and female portions of a socket, an adhesive, an underfill material, and/or any other suitable electrical and/or mechanical coupling structure.

The package-on-interposer structure 2336 may include an IC package 2320 coupled to an interposer 2304 by coupling components 2318. The coupling components 2318 may take any suitable form for the application, such as the forms discussed above with reference to the coupling components 2316. The IC package 2320 may be or include, for example, a die (the die 2002 of FIG. 6B), an IC device (e.g., the IC device of FIGS. 1-2), or any other suitable component. In particular, the IC package 2320 may include one or more varactor devices as described herein. Although a single IC package 2320 is shown in FIG. 8, multiple IC packages may be coupled to the interposer 2304; indeed, additional interposers may be coupled to the interposer 2304. The interposer 2304 may provide an intervening substrate used to bridge the circuit board 2302 and the IC package 2320. Generally, the interposer 2304 may spread a connection to a wider pitch or reroute a connection to a different connection. For example, the interposer 2304 may couple the IC package 2320 (e.g., a die) to a BGA of the coupling components 2316 for coupling to the circuit board 2302. In the embodiment illustrated in FIG. 8, the IC package 2320 and the circuit board 2302 are attached to opposing sides of the interposer 2304; in other embodiments, the IC package 2320 and the circuit board 2302 may be attached to a same side of the interposer 2304. In some embodiments, three or more components may be interconnected by way of the interposer 2304.

The interposer 2304 may be formed of an epoxy resin, a fiberglass-reinforced epoxy resin, a ceramic material, or a polymer material such as polyimide. In some implementations, the interposer 2304 may be formed of alternate rigid or flexible materials that may include the same materials described above for use in a semiconductor substrate, such as silicon, germanium, and other group III-V and group IV materials. The interposer 2304 may include metal interconnects 2308 and vias 2310, including but not limited to TSVs 2306. The interposer 2304 may further include embedded devices 2314, including both passive and active devices. Such devices may include, but are not limited to, capacitors, decoupling capacitors, resistors, inductors, fuses, diodes, transformers, sensors, ESD protection devices, and memory devices. More complex devices such as further RF devices, power amplifiers, power management devices, antennas, arrays, sensors, and microelectromechanical systems (MEMS) devices may also be formed on the interposer 2304. In some embodiments, the IC devices implementing one or more varactor devices as described herein may also be implemented in/on the interposer 2304. The package-on-interposer structure 2336 may take the form of any of the package-on-interposer structures known in the art.

The IC device assembly 2300 may include an IC package 2324 coupled to the first face 2340 of the circuit board 2302 by coupling components 2322. The coupling components 2322 may take the form of any of the embodiments discussed above with reference to the coupling components 2316, and the IC package 2324 may take the form of any of the embodiments discussed above with reference to the IC package 2320.

The IC device assembly 2300 illustrated in FIG. 8 includes a package-on-package structure 2334 coupled to the second face 2342 of the circuit board 2302 by coupling components 2328. The package-on-package structure 2334 may include an IC package 2326 and an IC package 2332 coupled together by coupling components 2330 such that the IC package 2326 is disposed between the circuit board 2302 and the IC package 2332. The coupling components 2328 and 2330 may take the form of any of the embodiments of the coupling components 2316 discussed above, and the IC packages 2326 and 2332 may take the form of any of the embodiments of the IC package 2320 discussed above. The package-on-package structure 2334 may be configured in accordance with any of the package-on-package structures known in the art.

Figure 9:
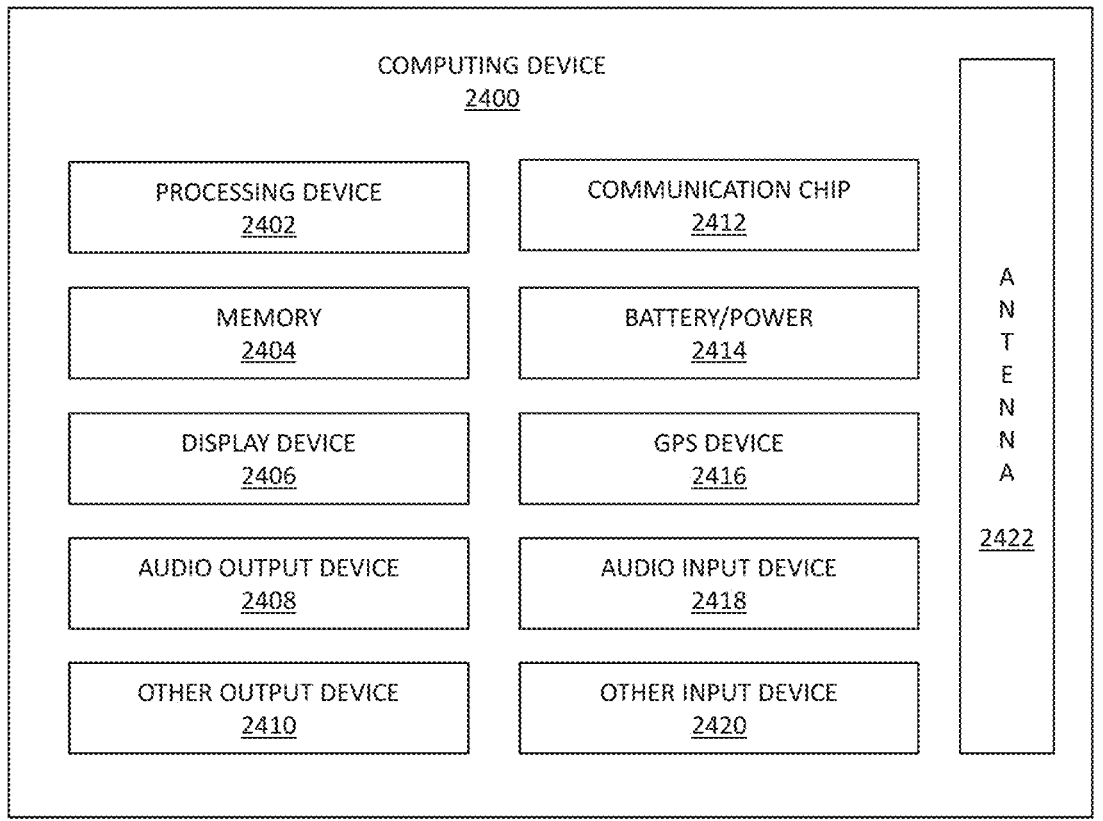
FIG. 9 is a block diagram of an example computing device that may include one or more components with varactor devices with backside electrical contact, according to some embodiments of the disclosure.

FIG. 9 is a block diagram of an example computing device 2400 that may include one or more components with one or more IC devices having one or more varactor devices, according to some embodiments of the disclosure. For example, any suitable ones of the components of the computing device 2400 may include a die (e.g., the die 2002 of FIG. 6B) including one or more varactor devices, according to some embodiments of the disclosure. Any of the components of the computing device 2400 may include a varactor device (e.g., any embodiment of the varactors devices of FIGS. 1 and 2-10) and/or an IC package (e.g., the IC package 2200 of FIG. 7). Any of the components of the computing device 2400 may include an IC device assembly (e.g., the IC device assembly 2300 of FIG. 8).

A number of components are illustrated in FIG. 9 as included in the computing device 2400, but any one or more of these components may be omitted or duplicated, as suitable for the application. In some embodiments, some or all of the components included in the computing device 2400 may be attached to one or more motherboards. In some embodiments, some or all of these components are fabricated onto a single SoC (system-on-chip) die.

Additionally, in various embodiments, the computing device 2400 may not include one or more of the components illustrated in FIG. 9, but the computing device 2400 may include interface circuitry for coupling to the one or more components. For example, the computing device 2400 may not include a display device 2406, but may include display device interface circuitry (e.g., a connector and driver circuitry) to which a display device 2406 may be coupled. In another set of examples, the computing device 2400 may not include an audio input device 2418 or an audio output device 2408, but may include audio input or output device interface circuitry (e.g., connectors and supporting circuitry) to which an audio input device 2418 or audio output device 2408 may be coupled.

The computing device 2400 may include a processing device 2402 (e.g., one or more processing devices). As used herein, the term "processing device" or "processor" may refer to any device or portion of a device that processes electronic data from registers and/or memory to transform that electronic data into other electronic data that may be stored in registers and/or memory. The processing device 2402 may include one or more digital signal processors (DSPs), application-specific ICs (ASICs), central processing units (CPUs), graphics processing units (GPUs), cryptoprocessors (specialized processors that execute cryptographic algorithms within hardware), server processors, or any other suitable processing devices. The computing device 2400 may include a memory 2404, which may itself include one or more memory devices such as volatile memory (e.g., DRAM), nonvolatile memory (e.g., read-only memory (ROM)), flash memory, solid-state memory, and/or a hard drive. In some embodiments, the memory 2404 may include memory that shares a die with the processing device 2402. This memory may be used as cache memory and may include, e.g., eDRAM, and/or spin transfer torque magnetic random-access memory (STT-MRAM).

In some embodiments, the computing device 2400 may include a communication chip 2412 (e.g., one or more communication chips). For example, the communication chip 2412 may be configured for managing wireless communications for the transfer of data to and from the computing device 2400. The term "wireless" and its derivatives may be used to describe circuits, devices, systems, methods, techniques, communications channels, etc., that may communicate data through the use of modulated electromagnetic radiation through a nonsolid medium. The term does not imply that the associated devices do not contain any wires, although in some embodiments they might not.

The communication chip 2412 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultramobile broadband (UMB) project (also referred to as "3GPP2"), etc.). IEEE 802.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 802.16 standards. The communication chip 2412 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication chip 2412 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 2412 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. The communication chip 2412 may operate in accordance with other wireless protocols in other embodiments. The computing device 2400 may include an antenna 2422 to facilitate wireless communications and/or to receive other wireless communications (such as AM or FM radio transmissions).

In some embodiments, the communication chip 2412 may manage wired communications, such as electrical, optical, or any other suitable communication protocols (e.g., the Ethernet). As noted above, the communication chip 2412 may include multiple communication chips. For instance, a first communication chip 2412 may be dedicated to shorterrange wireless communications such as Wi-Fi or Bluetooth, and a second communication chip 2412 may be dedicated to longer-range wireless communications such as global positioning system (GPS), EDGE, GPRS, CDMA, WiMAX, LTE, EV-DO, or others. In some embodiments, a first communication chip 2412 may be dedicated to wireless communications, and a second communication chip 2412 may be dedicated to wired communications.

In various embodiments, IC devices having one or more varactor devices as described herein may be particularly advantageous for use as part of ESD circuits protecting power amplifiers, low-noise amplifiers, filters (including arrays of filters and filter banks), switches, or other active components. In some embodiments, IC devices having one or more varactor devices as described herein may be used in PMICs, e.g., as a rectifying diode for large currents. In some embodiments, IC devices having one or more varactor devices as described herein may be used in audio devices and/or in various input/output devices.

The computing device 2400 may include battery/power circuitry 2414. The battery/power circuitry 2414 may include one or more energy storage devices (e.g., batteries or capacitors) and/or circuitry for coupling components of the computing device 2400 to an energy source separate from the computing device 2400 (e.g., AC line power).

The computing device 2400 may include a display device 2406 (or corresponding interface circuitry, as discussed above). The display device 2406 may include any visual indicators, such as a heads-up display, a computer monitor, a projector, a touchscreen display, a liquid crystal display (LCD), a light-emitting diode display, or a flat panel display, for example.

The computing device 2400 may include an audio output device 2408 (or corresponding interface circuitry, as discussed above). The audio output device 2408 may include any device that generates an audible indicator, such as speakers, headsets, or earbuds, for example.

The computing device 2400 may include an audio input device 2418 (or corresponding interface circuitry, as discussed above). The audio input device 2418 may include any device that generates a signal representative of a sound, such as microphones, microphone arrays, or digital instruments (e.g., instruments having a musical instrument digital interface (MIDI) output).

The computing device 2400 may include a GPS device 2416 (or corresponding interface circuitry, as discussed above). The GPS device 2416 may be in communication with a satellite-based system and may receive a location of the computing device 2400, as known in the art.

The computing device 2400 may include an other output device 2410 (or corresponding interface circuitry, as discussed above). Examples of the other output device 2410 may include an audio codec, a video codec, a printer, a wired or wireless transmitter for providing information to other devices, or an additional storage device.

The computing device 2400 may include an other input device 2420 (or corresponding interface circuitry, as discussed above). Examples of the other input device 2420 may include an accelerometer, a gyroscope, a compass, an image capture device, a keyboard, a cursor control device such as a mouse, a stylus, a touchpad, a bar code reader, a Quick Response (QR) code reader, any sensor, or a radio frequency identification (RFID) reader.

The computing device 2400 may have any desired form factor, such as a handheld or mobile computing device (e.g., a cell phone, a smart phone, a mobile internet device, a music player, a tablet computer, a laptop computer, a netbook computer, an ultrabook computer, a personal digital assistant (PDA), an ultramobile personal computer, etc.), a desktop computing device, a server or other networked computing component, a printer, a scanner, a monitor, a set-top box, an entertainment control unit, a vehicle control unit, a digital camera, a digital video recorder, or a wearable computing device. In some embodiments, the computing device 2400 may be any other electronic device that processes data.

The following paragraphs provide various examples of the embodiments disclosed herein.

Example 1 provides an IC device, including a first interconnect set, including a first conductive structure in a first layer and a second conductive structure in a second layer, where the first conductive structure is separated from the second conductive structure by an electrical insulator; a second interconnect set, including a third conductive structure in a third layer and a fourth conductive structure in the third layer, where the first layer is between the second layer and the third layer in a direction; a first via connected with the first conductive structure and the third conductive structure; and a second via connected with the second conductive structure and the fourth conductive structure, where a length of the first via in the direction is greater than a length of the second via in the direction.

Example 2 provides the IC device according to example 1, where an edge of the first conductive structure is aligned with an edge of the second conductive structure in the direction.

Example 3 provides the IC device according to example 1 or 2, further including a semiconductor device, where the second layer is closer to the semiconductor device than the first layer.

Example 4 provides the IC device according to example 3, further including one or more vias between the first conductive structure and the semiconductor device; and a third via between the second conductive structure and the semiconductor device; where a length of the one or more vias in the direction is greater than a length of the third via in the direction.

Example 5 provides the IC device according to example 4, where the one or more vias include a fourth via and a fifth via, and the IC device further includes a dielectric material in a layer between the fourth via and the fifth via in the direction.

Example 6 provides the IC device according to any of the preceding examples, where the second conductive structure and the second via include a same metal.

Example 7 provides the IC device according to any of the preceding examples, where the first interconnect set further includes a fifth conductive structure in the first layer or in the second layer.

Example 8 provides the IC device according to example 6, where the fifth conductive structure is in the first layer; the IC device further includes a third via between the fifth layer and the second interconnect set, and a length of the third via in the direction is substantially equal to the length of the first via in the direction.

Example 9 provides the IC device according to any of the preceding examples, where a longitudinal axis of the first conductive structure is aligned with a longitudinal axis of the second conductive structure.

Example 10 provides the IC device according to any of the preceding examples, where a longitudinal axis of the first conductive structure is unaligned with a longitudinal axis of the third conductive structure.

Example 11 provides an IC device, including a transistor including a first electrode and a second electrode; an interconnect set having an alternating pattern of first conductive structurers and second conductive structures, where an individual first conductive structure is in a first layer, an individual second conductive structure is in a second layer, and the second layer is between the first layer and the transistor in a direction; a first via between the individual first conductive structure and the first electrode; and a second via between the individual second conductive structure and the first electrode, where a length of the first via in the direction is greater than a length of the second via in the direction.

Example 12 provides the IC device according to example 11, further including a third via between the individual first conductive structure and the first electrode; and a dielectric material in a layer between the first via and the third via in the direction.

Example 13 provides the IC device according to example 11 or 12, where an edge of the individual first conductive structure is aligned with an edge of the individual second conductive structure in the direction.

Example 14 provides the IC device according to any one of examples 11-13, where the first conductive structures and the second conductive structures are separated by one or more electrical insulators.

Example 15 provides the IC device according to example 11, where a longitudinal axis of the individual first conductive structure is aligned with a longitudinal axis of the individual second conductive structure.

Example 16 provides a method for forming an IC device, including forming one or more first vias in a first layer including a first electrical insulator; forming a second via in the first layer, where a length of the second via in a direction is smaller than a length of the one or more first vias in the direction; forming a first conductive structure in a second layer including a second electrical insulator, where the first conductive structure is over the one or more first vias in the direction; and forming a second conductive structure in the first layer, where the second conductive structure is over the second via in the direction.

Example 17 provides the method according to example 16, where the first layer includes a first portion and a second portion, the first portion is between the second layer and the second portion, forming the one or more first vias includes forming a first via in the first portion and forming another first via in the second portion; and forming the second via includes forming the second via in the second portion.

Example 18 provides the method according to example 16 or 17, further including forming a third via over the first conductive structure, where the first conductive structure is between the one or more first vias and the third via; and forming a fourth via over the second conductive structure, where the second conductive structure is between the second vias and the fourth via, where a length of the third via in the direction is greater than a length of the fourth via in the direction.

Example 19 provides the method according to example 18, where the second conductive structure and the fourth via are formed by forming an opening in the first layer and the second layer; and providing an electrically conductive material into the opening.

Example 20 provides the method according to any one of examples 16-19, where an edge of the first conductive structure is aligned with an edge of the second conductive structure in the direction by using a DSA of a diblock copolymer.

Example 21 provides an IC package, including the IC device according to any one of examples 1-15; and a further IC component, coupled to the device.

Example 22 provides the IC package according to example 21, where the further IC component includes one of a package substrate, an interposer, or a further IC die.

Example 23 provides the IC package according to example 21 or 22, where the IC device according to any one of examples 1-15 may include, or be a part of, at least one of a memory device, a computing device, a wearable device, a handheld electronic device, and a wireless communications device.

Example 24 provides an electronic device, including a carrier substrate; and one or more of the IC device according to any one of examples 1-15 and the IC package according to any one of examples 21-23, coupled to the carrier substrate.

Example 25 provides the electronic device according to example 24, where the carrier substrate is a motherboard.

Example 26 provides the electronic device according to example 24, where the carrier substrate is a PCB.

Example 27 provides the electronic device according to any one of examples 24-26, where the electronic device is a wearable electronic device or handheld electronic device.

Example 28 provides the electronic device according to any one of examples 24-27, where the electronic device further includes one or more communication chips and an antenna.

Example 29 provides the electronic device according to any one of examples 24-28, where the electronic device is an RF transceiver.

Example 30 provides the electronic device according to any one of examples 24-28, where the electronic device is one of a switch, a power amplifier, a low-noise amplifier, a filter, a filter bank, a duplexer, an upconverter, or a downconverter of an RF communications device, e.g., of an RF transceiver.

Example 31 provides the electronic device according to any one of examples 24-30, where the electronic device is a computing device.

Example 32 provides the electronic device according to any one of examples 24-31, where the electronic device is included in a base station of a wireless communication system.

Example 33 provides the electronic device according to any one of examples 24-31, where the electronic device is included in a user equipment device of a wireless communication system.

Example 34 provides the method according to any one of examples 16-20, further including processes for forming the IC device according to any one of examples 1-15.

Example 35 provides the method according to any one of examples 16-20, further including processes for forming the IC package according to any one of the examples 21-23.

Example 36 provides the method according to any one of examples 15-20, further including processes for forming the electronic device according to any one of the examples 24-33.

The above description of illustrated implementations of the disclosure, including what is described in the Abstract, is not intended to be exhaustive or to limit the disclosure to the precise forms disclosed. While specific implementations of, and examples for, the disclosure are described herein for illustrative purposes, various equivalent modifications are possible within the scope of the disclosure, as those skilled in the relevant art will recognize. These modifications may be made to the disclosure in light of the above detailed description.

The invention claimed is:

1. An integrated circuit (IC) device, comprising:
a first interconnect set, comprising a first conductive structure in a first layer and a second conductive structure in a second layer, wherein the first conductive structure is separated from the second conductive structure by an electrical insulator;
a second interconnect set, comprising a third conductive structure in a third layer and a fourth conductive structure in the third layer, wherein the first layer is between the second layer and the third layer in a direction;
a first via connected with the first conductive structure and the third conductive structure; and
a second via connected with the second conductive structure and the fourth conductive structure, wherein a length of the first via in the direction is smaller than a length of the second via in the direction.

2. The IC device according to claim 1, wherein an edge of the first conductive structure is aligned with an edge of the second conductive structure in the direction.

3. The IC device according to claim 1, further comprising a semiconductor device, wherein the second layer is closer to the semiconductor device than the first layer.

4. The IC device according to claim 3, further comprising:
one or more vias between the first conductive structure and the semiconductor device; and
a third via between the second conductive structure and the semiconductor device;
wherein a length of the one or more vias in the direction is greater than a length of the third via in the direction.

5. The IC device according to claim 4, wherein the one or more vias comprise a fourth via and a fifth via, and the IC device further comprises a dielectric material in a layer between the fourth via and the fifth via in the direction.

6. The IC device according to claim 1, wherein the second conductive structure and the second via comprise a same metal.

7. The IC device according to claim 1, wherein the first interconnect set further comprises a fifth conductive structure in the first layer or in the second layer.

8. The IC device according to claim 7, wherein:
the fifth conductive structure is in the first layer;
the IC device further comprises a third via between the fifth conductive structure and the second interconnect set, and
a length of the third via in the direction is substantially equal to the length of the first via in the direction.

9. The IC device according to claim 1, wherein a longitudinal axis of the first conductive structure is in parallel with a longitudinal axis of the second conductive structure.

10. The IC device according to claim 1, wherein a longitudinal axis of the first conductive structure is orthogonal to a longitudinal axis of the third conductive structure.

11. An integrated circuit (IC) device, comprising:
a transistor comprising a first electrode and a second electrode;
an interconnect set having an alternating pattern of first conductive structurers and second conductive structures, wherein an individual first conductive structure is in a first layer, an individual second conductive structure is in a second layer, and the second layer is between the first layer and the transistor in a direction;

a first via between the individual first conductive structure and the first electrode; and
a second via between the individual second conductive structure and the second electrode,
wherein a length of the first via in the direction is greater than a length of the second via in the direction.

12. The IC device according to claim 11, further comprising:
a third via between the individual first conductive structure and the first electrode; and
a dielectric material in a layer between the first via and the third via in the direction.

13. The IC device according to claim 11, wherein an edge of the individual first conductive structure is aligned with an edge of the individual second conductive structure in the direction.

14. The IC device according to claim 11, wherein the first conductive structures and the second conductive structures are separated by one or more electrical insulators.

15. The IC device according to claim 11, wherein a longitudinal axis of the individual first conductive structure is in parallel with a longitudinal axis of the individual second conductive structure.

16. A method for forming an integrated circuit (IC) device, comprising:
forming one or more first vias in a first layer comprising a first electrical insulator;
forming a second via in the first layer, wherein a length of the second via in a direction is smaller than a length of the one or more first vias in the direction;
forming a first conductive structure in a second layer comprising a second electrical insulator, wherein the first conductive structure is over the one or more first vias in the direction; and
forming a second conductive structure in the second layer, wherein the second conductive structure is over the second via in the direction.

17. The method according to claim 16, wherein:
the first layer comprises a first portion and a second portion,
the first potion is between the second layer and the second portion,
forming the one or more first vias comprises forming a first via in the first portion and forming another first via in the second portion, and
forming the second via comprises forming the second via in the second portion.

18. The method according to claim 16, further comprising:
forming a third via over the first conductive structure, wherein the first conductive structure is between the one or more first vias and the third via; and
forming a fourth via over the second conductive structure, wherein the second conductive structure is between the second via and the fourth via,
wherein a length of the third via in the direction is smaller than a length of the fourth via in the direction.

19. The method according to claim 18, wherein the second conductive structure and the fourth via are formed by:
forming an opening in the first layer and the second layer; and
providing an electrically conductive material into the opening.

20. The method according to claim 16, wherein an edge of the first conductive structure is aligned with an edge of the second conductive structure in the direction by using a directed self-assembly of a diblock copolymer.

* * * * *